United States Patent
Cheng et al.

(10) Patent No.: US 7,239,978 B2
(45) Date of Patent: Jul. 3, 2007

(54) COMPACTOR INDEPENDENT FAULT DIAGNOSIS

(76) Inventors: Wu-Tung Cheng, 19030 SW. 35th Pl., Lake Oswego, OR (US) 97034; Kun-Han Tsai, 12997 Sierra Vista Dr., Lake Oswego, OR (US) 97035; Yu Huang, 89 Ewald Ave., Marlborough, MA (US) 01752; Nagesh Tamarapalli, 29290 SW. Parkway Ct., Apt. 93, Wilsonville, OR (US) 97070; Janusz Rajski, 6502 Horton Rd., West Linn, OR (US) 97068

( * ) Notice: Subject to any disclaimer, the term of this patent is extended or adjusted under 35 U.S.C. 154(b) by 0 days.

(21) Appl. No.: 10/925,230

(22) Filed: Aug. 23, 2004

(65) Prior Publication Data

US 2005/0222816 A1    Oct. 6, 2005

Related U.S. Application Data

(60) Provisional application No. 60/558,405, filed on Mar. 31, 2004.

(51) Int. Cl.
*G06F 11/30* (2006.01)
*G01R 31/28* (2006.01)

(52) U.S. Cl. ................................. 702/185; 714/729
(58) Field of Classification Search ................ 702/185; 714/700, 25, 30, 729, 726, 732, 742
See application file for complete search history.

(56) References Cited

U.S. PATENT DOCUMENTS 5,475,694 A * 12/1995 Ivanov et al. ............... 714/732
5,515,384 A    5/1996 Horton et al.
5,831,992 A * 11/1998 Wu ............................. 714/732
5,930,270 A    7/1999 Forlenza et al.
5,991,898 A * 11/1999 Rajski et al. .................. 714/30
6,158,033 A   12/2000 Wagner et al.
6,199,184 B1   3/2001 Sim
6,205,559 B1   3/2001 Sakaguchi
6,256,759 B1 *  7/2001 Bhawmik et al. ........... 714/726
6,363,506 B1   3/2002 Karri et al.

(Continued)

OTHER PUBLICATIONS

Ivanov et al., Programmable BIST Space Compactors, Dec. 1996, IEEE Transactions on Computers, vol. 45, No. 12, pp. 1393-1404.*

(Continued)

*Primary Examiner*—John Barlow
*Assistant Examiner*—Toan M. Le
(74) *Attorney, Agent, or Firm*—Klarquist Sparkman, LLP

(57) ABSTRACT

Methods, apparatus, and systems for performing fault diagnosis are disclosed herein. In certain disclosed embodiments, methods for diagnosing faults from compressed test responses are provided. For example, in one exemplary embodiment, a circuit description of an at least partially scan-based circuit-under-test and a compactor for compacting test responses captured in the circuit-under-test is received. A transformation function performed by the compactor to the test responses captured in the circuit-under-test is determined. A diagnostic procedure for evaluating uncompressed test responses is modified into a modified diagnostic procedure that incorporates the transformation function therein. Computer-readable media comprising computer-executable instructions for causing a computer to perform any of the disclosed methods are also provided. Likewise, computer-readable media comprising lists of fault candidates identified by any of the disclosed methods or circuit descriptions created or modified by the disclosed methods are provided.

46 Claims, 19 Drawing Sheets

U.S. PATENT DOCUMENTS

| | | | |
|---|---|---|---|
| 6,442,723 B1 | 8/2002 | Koprowski et al. | |
| 6,463,561 B1 * | 10/2002 | Bhawmik et al. | 714/733 |
| 6,516,432 B1 | 2/2003 | Motika et al. | |
| 6,557,129 B1 * | 4/2003 | Rajski et al. | 714/729 |
| 6,557,132 B2 | 4/2003 | Gangl et al. | |
| 6,671,839 B1 | 12/2003 | Cote et al. | |
| 6,684,358 B1 * | 1/2004 | Rajski et al. | 714/739 |
| 6,694,466 B1 * | 2/2004 | Tsai et al. | 714/729 |
| 6,728,901 B1 * | 4/2004 | Rajski et al. | 714/30 |
| 6,763,488 B2 * | 7/2004 | Whetsel | 714/729 |
| 6,829,740 B2 * | 12/2004 | Rajski et al. | 714/729 |
| 6,954,888 B2 * | 10/2005 | Rajski et al. | 714/739 |
| 7,032,148 B2 * | 4/2006 | Wang et al. | 714/729 |
| 2004/0190331 A1 | 9/2004 | Ross et al. | |
| 2005/0055613 A1 * | 3/2005 | Mitra et al. | 714/726 |

OTHER PUBLICATIONS

Venkataraman et al., A Deductive Technique for Diagnosis of Bridging Faults, 1997 IEEE, pp. 562-567.*
Bhattacharya et al., Synthesis of Single-Output Space Compactors for Scan-Based Sequential Circuits, Oct. 2002, IEEE Transactions on Computer-Aided Design of Integrated Circuits and Systems, vol. 21, No. 10, pp. 1171-1179.*
Chakrabarty et al., Space Compaction of Test Responses Using Orthogonal Transmission Functions, Oct. 2003, IEEE Transactions on Instrumentation and Measurement, vol. 52, No. 5, pp. 1353-1362.*
Cheng et al., Diagnosis for Wiring Interconnects, 1990 IEEE, pp. 565-571.*
Tsuji et al., Selecting Programmable Space Compactors for BIST Using Genetic Algorithm, 1994 IEEE, pp. 233-241.*
Devgan et al., Block-Based Static Timing Analysis With Uncertainty, ICCAD 2003, pp. 607-614.*
Ivanov et al., Programmable BIST Space Compactors, Dec. 1996, IEEE Transactions on Computers, vol. 45, No. 12, pp. 1393-1404.*
Bardell et al., *Built-In Test for VLSI: Pseudorandom Techniques*, John Wiley & Sons, Inc., Chapter 5, pp. 109-144 (1987).
Aldrich et al., "Improving Test Quality and Reducing Escapes," *Fabless Forum*, 2 pp. (2003).
Barnhart et al., "Extending OPMISR beyond 10x Scan Test Efficienc," *IEEE Design & Test of Computers*, pp. 65-73 (2002).
Benware et al., "Impact of Multiple-Detect Test Patterns on Product Quality," *ITC International Test Conference*, pp. 1031-1040 (2003).
Boppana et al., "Multiple Error Diagnosis Based on Xlists," *Design Automation Conference Proc. 36th*, pp. 660-665 (1999).
Chan et al., "A Study of Faulty Signatures Using a Matrix Formulation," *International Test Conference*, pp. 553-561 (1990).
Cox et al., "Method of Fault Analysis for Test Generation and Fault Diagnosis," *IEEE Trans. on CAD*, vol. 7, No. 7 pp. 813-833 (1988).
Huang et al., "ErrorTracer: A Fault Simulation-Based Approach to Design Erorr Diagnosis," *International Test Conference*, pp. 974-981 (1997).
Ivanov et al., "Programmable BIST Space Compactors," *IEEE Trans. on Computers*, vol. 45, No. 12, pp. 1393-1404 (1996).
Lin et al., "High-Frequency, At-Speed Scan Testing," *IEEE Design and Test of Computers*, vol. 20, Issue 5, pp. 17-25 (2003).
Mitra et al., "X-Compact An Efficient Response Compaction Technique for Test Cost Reduction," *ITC International Test Conference*, pp. 311-320 (2002).
Poehl et al., "Industrial Experience with Adoption of EDT for Low-Cost Test without Concessions," *ITC International Test Conference*, pp. 1211-1220 (2003).
Pomeranz et al., "On Correction of Multiple Design Errors," *IEEE Trans. on CAD of Integrated Circuits and Systems*, vol. 14, No. 2, pp. 255-264 (1995).
Pouya et al., "Synthesis of Zero-Aliasing Elementary-Tree Space Compactors," *Proc. of IEEE VLSI Test Symposium*, pp. 70-77 (1998).

Rajski et al., "Embedded Deterministic Test for Low Cost Manufacturing Test," *ITC International Test Conference*, pp. 301-310 (2002).
Rajski et al., "Convolutional Compaction of Test Responses," *ITC International Test Conference*, pp. 745-754 (2003).
Richman et al., "The Modern Fault Dictionary," *International Test Conference*, pp. 696-702 (1985).
Takahashi et al., "Enhancing Multiple Fault Diagnosis in Combinational Circuits Based on Sensitized Paths and EB Testing," *The Fourth Asian Test Symposium*, pp. 58-64 (1995).
Venkataraman et al., "A Deductive Technique for Diagnosis of Bridging Faults," *Proc. IEEE ICCAD*, pp. 562-567 (1997).
Veneris et al., "A Fast Algorithm for Locating and Correcting Simple Design Errors in VLSI Digital Circuits," *Proc. of Great Lake Symposium on VLSI Design*, pp. 45-50 (1997).
Wang, "On Methods to Improve Test Generation Efficiency and Test Response Compaction," Ph.D. Thesis, University of Iowa, 138 pp. (2003).
Akers et al., "Why is less information from logic simulation more useful in fault simulation," *International Test Conference*, pp. 786-800 (1990).
Balachandran et al., "Correlation of Logic Failures to a Suspect Process Step," *International Test Conference*, pp. 458-466 (1999).
Bartenstein et al., "Diagnosing Combinational Logic Designs using the Single Location At-A-Time (SLAT) Paradigm," *International Test Conference*, pp. 287-296 (2001).
Ghosh-Dastidar et al., "Fault Diagnosis in Scan Based BIST Using Both Time and Space Information," *International Test Conference*, (1999).
Ghosh-Dastidar et al., "A Rapid and Scalable Diagnosis Scheme for BIST Environments with a Large Number of Scan Chains," *Proceedings of the VLSI Test Symposium*, (2000).
Guo et al., "A Technique for Fault Diagnosis of Defects in Scan Chains," *International Test Conference*, pp. 268-277 (2001).
Kapur et al., "Directed-Binary Search in Logic BIST Diagnostics," *Proceedings of the Design, Automation and Test in Europe Conference and Exhibition*, 2002.
Koenemann et al., "Built in Logic Block Observation Techniques," *International Test Conference*, (1979).
McAnney et al., "There is Information in Faulty Signatures," *International Test Conference*, (1987).
Rajski et al., "Diagnosis of Scan Cells in BIST Environment," *IEEE Transactions on Computers*, vol. 48, No. 7, Jul. 1999.
Savir et al., "Identification of Failing Tests with Cycling Registers," *International Test Conference*, pp. 322-328 (1988).
Stroud, "Automated BIST for Sequential Logic Synthesis," *IEEE Design and Test of Computers*, (1988).
Wohl et al., "Effective Diagnostics Through Interval Unloads in a BIST Environment," *Proceedings of the Design Automation Conference*, (2002).
Wu et al., "Scan Based BIST Fault Diagnosis," *IEEE Transactions on Computer-Aided Design of Integrated Circuits and Systems*, vol. 18, No. 2, Feb. 1999.
Bayraktaroglu and Orailoglu, "Test Volume and Application Time Reduction," *Proc. Design Automation Conf.*, pp. 151-155, 2001.
Edirisooriya et al., "Diagnosis of Scan Path Failures," *Proc. of VLSI Test Symposium*, pp. 250-255, 1995.
Hamzaoglu and Patel, "Reducing Test Application Time for Full-Scan Embedded Cores", *Proc. of Fault-Tolerant Computing*, pp. 15-18, 1999.
Huang et al., "Diagnosing DACS (Defects That Affect Scan Chain and System Logic)," *International Symposium on Testing and Failure Analysis*, pp. 191-196, Nov. 2004.
Huang et al., "Efficient Diagnosis for Multiple Intermittent Scan Chain Hold-Time Faults," *Proc. Asian Test Symposium*, pp. 44-49, Nov. 16-19, 2003.
Huang et al., "Intermittent Scan Chain Fault Diagnosis Based on Signal Probability Analysis," *Proc. of the Design, Automation and Test in Europe Conference and Exhibition*, pp. 1072-1077, Feb. 16-20, 2004.
Huang et al. "Statistical Diagnosis for Intermittent Scan Chain Hold-Time Fault," *International Test Conference*, pp. 319-328, Sep. 30-Oct. 2, 2003.

Jas, et al., "Scan Vector Compression/Decompression Using Statistical Coding," *Proc. VLSI Test Symp.*, pp. 114-120, 1999.

Krishna et al., "Test Vector Encoding Using Partial LFSR Reseeding," *International Test Conference*, pp. 885-893, 2001.

Kundu, "Diagnosing Scan Chain Faults," *IEEE Transactions on VLSI Systems*, vol. 2:4, pp. 512-516, 1994.

Li and McCluskey, "Diagnosis of Sequence Dependent Chips," *Proc. 20th VLSI Test Symposium*, pp. 187-192, 2002.

Narayanan et al., "An Efficient Scheme to Diagnose Scan Chains," *International Test Conference*, pp. 704-713, 1997.

Savir, "Salvaging Test Windows in BIST Diagnostics," *IEEE Transactions on Computers*, vol. 47:4, Apr. 1998.

Schafer et al., "Partner SRLs for Improved Shift Register Diagnostics," *Proc. VLSI Test Symposium*, pp. 198-201, 1992.

Stanley, "High-Accuracy Flush-and-Scan Software Diagnostic," *IEEE Design and Test of Computers*, pp. 56-62, Nov.-Dec. 2001.

Venketaraman and Drummonds, "Poirot: Applications of a Logic Fault Diagnosis Tool," *IEEE Design and Test of Computers*, vol. 18, No. 1, Jan.-Feb. 2001.

Waicukauski and Lindbloom, "Failure Diagnosis of Structured VLSI," *IEEE Design and Test of Computers*, pp. 49-60, Aug. 1989.

Wang et al., "An Efficient and Effective Methodology on the Multiple Fault Diagnosis," *International Test Conference*, pp. 329-338, Sep. 30-Oct. 2, 2003.

Wohl et al., "Xtolerant Compression and Application of Scan-ATPG Patterns in a BIST Architecture," *International Test Conference*, pp. 727-736, Sep. 30-Oct. 2, 2003.

Wu, "Diagnosis of Scan Chain Failures," *Proc. International Symposium on Defect and Fault Tolerance in VLSI Systems*, pp. 217-222, 1998.

Zou, "On Methods to Improve Location Based Logic Diagnosis," *Proc. VLSI Design*, pp. 181-187, 2000.

\* cited by examiner

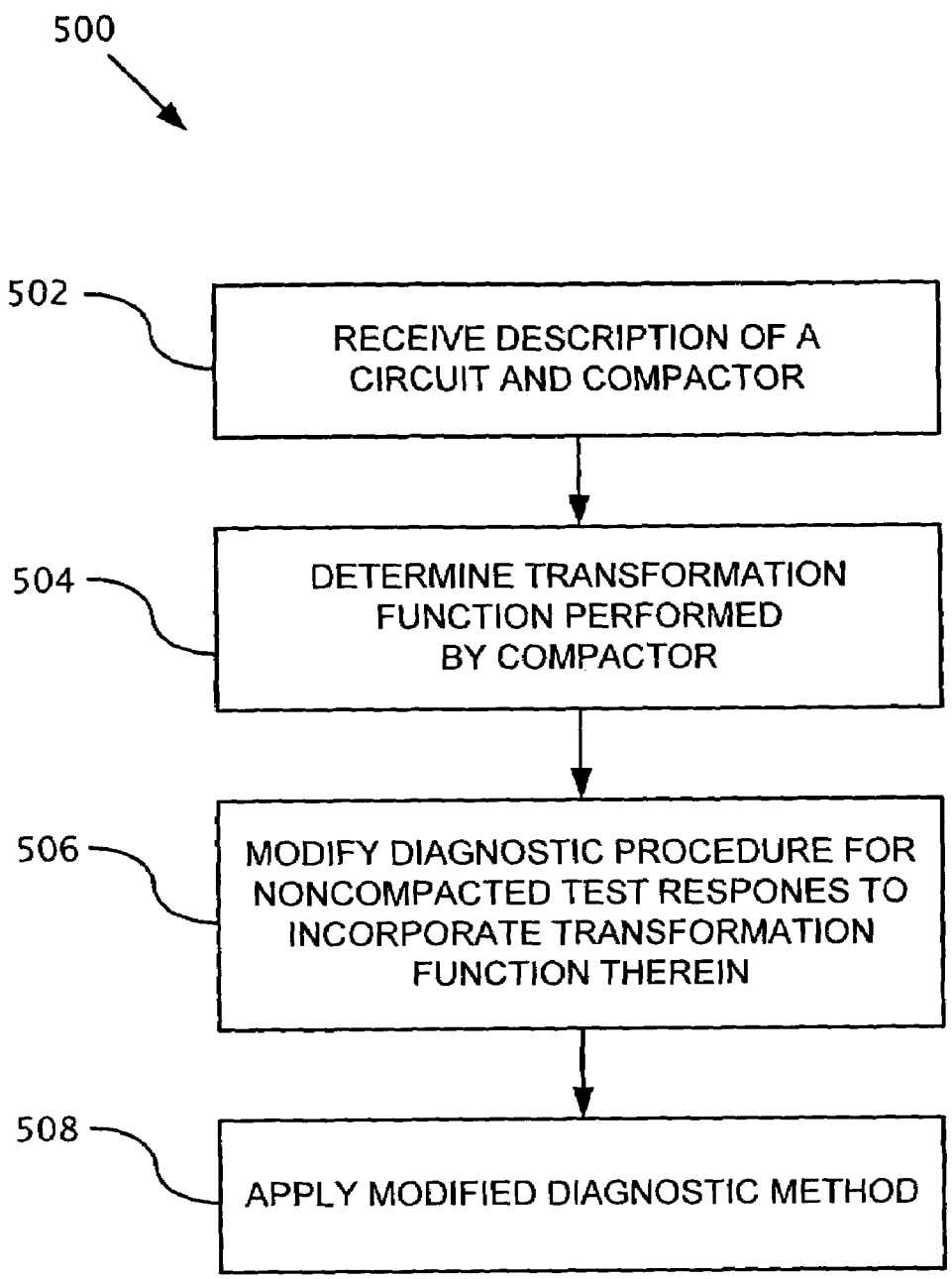

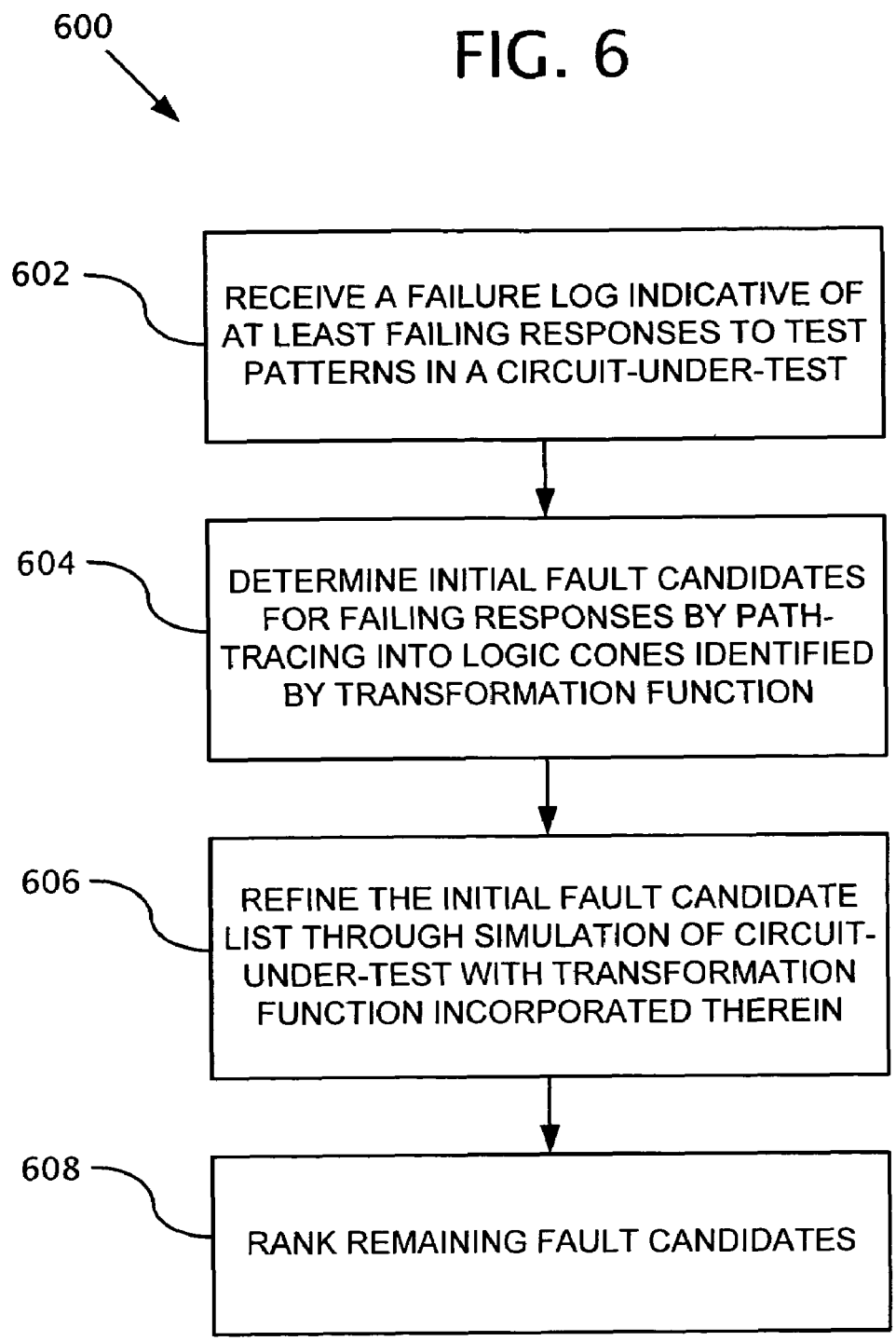

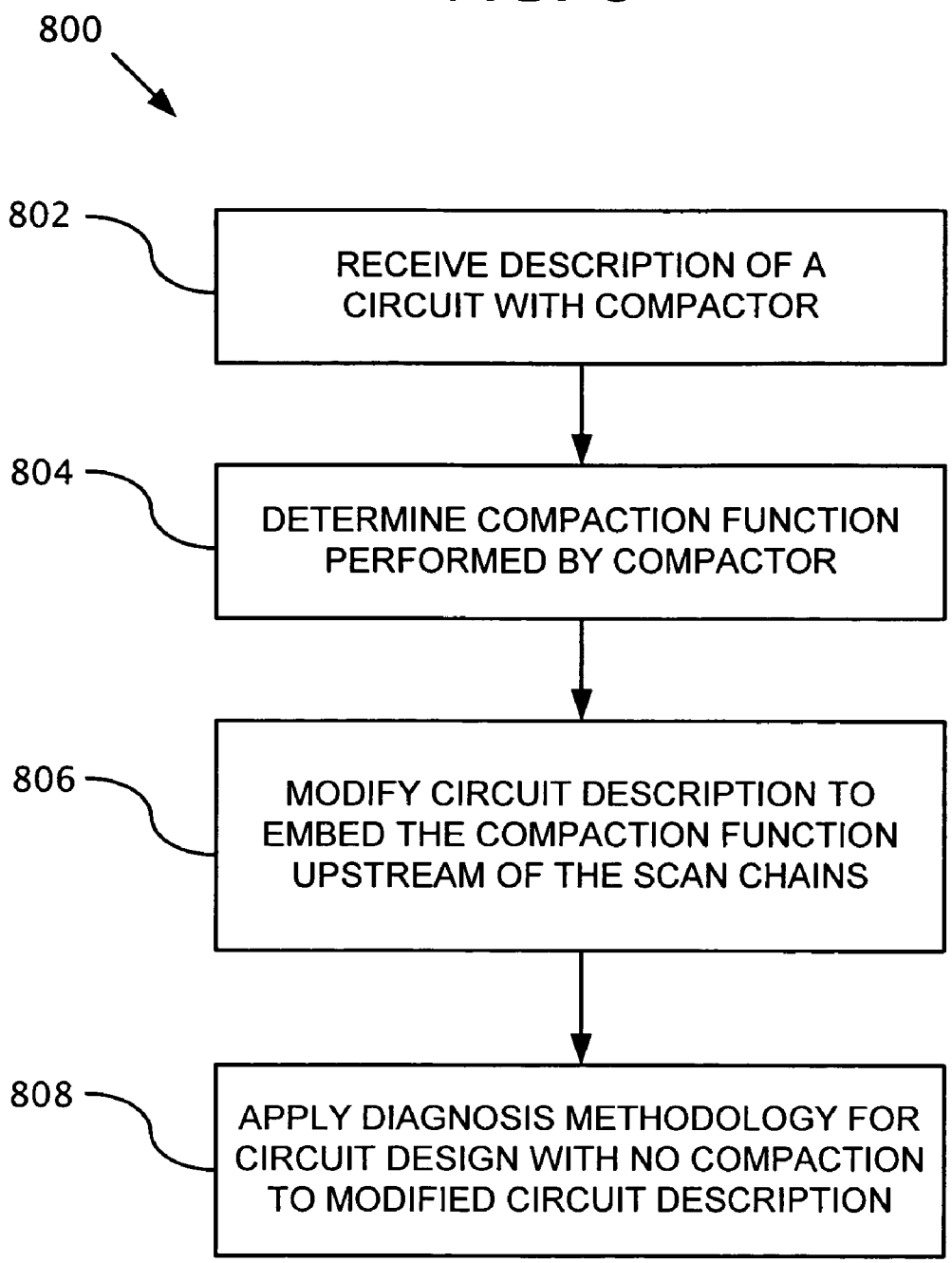

Diagnostic Results for Circuit 1 Using Bypass Mode

Diagnostic Results for Circuit 1 Using An Embodiment of
Disclosed Diagnosis Methodology Diagnostic Results for Circuit 2 Using Bypass Mode Diagnostic Results for Circuit 2 Using An Embodiment of
Disclosed Diagnosis Methodology

COMPACTOR INDEPENDENT FAULT DIAGNOSIS

CROSS REFERENCE TO RELATED APPLICATION

This application claims the benefit U.S. Provisional Patent Application No. 60/558,405, filed on Mar. 31, 2004, which is incorporated herein by reference.

FIELD

This application relates to diagnosing defects in an integrated circuit.

BACKGROUND

The accurate diagnosis of faults is an increasingly important aspect of testing integrated circuits, especially in view of ever-increasing gate counts and shrinking feature sizes. For circuits that do not utilize compression techniques during testing, fault diagnosis is relatively straightforward. For circuits that have embedded compression hardware, however, accurate fault diagnosis presents a formidable challenge.

The use of compression during the testing of integrated circuits has become widespread. In general, compression helps reduce the volume of test data required for even traditional stuck-at test sets. Such test sets, for example, often exceed the capacity of automatic test equipment (ATE) used to test today's multimillion-gate integrated circuits. Moreover, due to the limited bandwidth between the circuit-under-test (CUT) and the ATE, the use of compressed test data and compressed test responses can decrease test time, and thus the test cost.

Automated fault diagnosis (e.g., diagnosis based on scan patterns obtained from automated test pattern generation (ATPG)) is a desirable component of an overall failure-analysis process. Automated fault diagnosis is generally used to predict the location of a failure and has applications in such fields as silicon debugging, yield learning, and yield improvement. Given the failing test responses to a test set, an automated fault diagnosis tool can be utilized to identify the suspect fault sites that best explain the failures. The suspect sites identified can help locate the physical cause of the fault and be used to guide failure analysis at the physical level.

SUMMARY

In one of the disclosed methods, a failure log comprising one or more entries indicative of failing test responses captured in a circuit-under-test and compressed by a compactor is received. The circuit-under-test comprises scan cells that receive test responses from corresponding logic cones. The compactor can be, for example, a space compactor, an infinite input response compactor, or a finite input response compactor. The compactor may additionally comprise masking logic. In the disclosed method, one or more candidate logic cones are identified for a selected entry of the failure log using a transformation function indicative of which logic cones in the circuit-under-test at least partially contribute to respective failing test responses. Fault candidates are found in the one or more candidate logic cones using a representation of the circuit-under-test. The method may further comprise simulating failing test patterns in a representation of the circuit-under-test and compactor in the presence of a selected fault candidate. In some implementations of the method, the one or more candidate logic cones are identified for multiple respective entries of the failure log, wherein each of the multiple respective entries of the failure log are associated with a single test pattern. Fault candidates are then found at the intersection of the union of the identified candidate logic cones for the multiple respective entries.

In another disclosed method, a representation of a circuit-under-test is transformed into a representation of a transformed circuit-under-test. The original circuit-under-test comprises scan cells that capture test responses from respective logic cones and a compactor that compresses the captured test responses. By contrast, the transformed circuit-under-test replaces one or more of the scan cells in the circuit-under-test with one or more pseudo-scan-cells configured to capture respective compacted test responses. The one or more pseudo-scan-cells are associated with corresponding logic cones via a representation of the compactor (e.g., a representation of the compactor that indicates which logic cones in the circuit-under-test at least partially contribute to respective failing test responses without representing the Boolean function of the compactor). In some implementations, faults in the circuit-under-test are diagnosed using the representation of the transformed circuit-under-test. The diagnosis can be performed using an effect-cause diagnostic procedure, which may comprise determining a list of fault candidates by path tracing in the representation of the modified circuit-under-test from one or more pseudo-scan-cells into respective associated candidate logic cones.

In another disclosed method, a failure log indicative of one or more failing responses of a circuit-under-test to one or more test patterns applied to the circuit-under-test is received. In this embodiment, the failing responses in the failure log were first captured in scan cells of the circuit-under-test and then compressed by a compactor. A mathematical representation of the compactor is applied to the one or more failing responses in order to identify one or more respective candidate logic cones wherein a potential fault causing the failing response might exist. An effect-cause diagnostic procedure is applied to the one or more respective candidate logic cones. In certain implementations, the representation of the compactor indicates which logic cones in the circuit-under-test at least partially contribute to respective failing test responses without representing the Boolean function of the compactor. The effect-cause diagnostic procedure used in this embodiment may comprise path tracing into the one or more identified logic cones using a representation of the circuit-under-test, the path tracing being performed to determine a list of fault candidates. In some implementations, the list of fault candidates consists of fault candidates in the intersection of unions of the respective candidate logic cones. The effect-cause diagnostic procedure may further comprise simulating the application of one or more of the test patterns to the circuit-under-test and compactor with one of the fault candidates being present in the circuit-under-test.

In another disclosed method, information indicative of one or more failing test responses of a circuit-under-test to one or more test patterns applied to the circuit-under-test is received, wherein the failing test responses were first captured in scan cells of the circuit-under-test and then compressed by a compactor. The method further comprises identifying fault candidates for one or more of the failing test responses using a path-tracing technique applied to a representation of a transformed circuit-under-test. In this embodiment, the representation of the transformed circuitunder-test represents the failing test responses as being compacted first and then captured in pseudo-scan-cells. The portion of the representation of the circuit-under-test associated with compacting the failing test responses may comprise, for example, a transformed circuit description or a mathematical relationship.

In another disclosed method, a circuit description is received that describes a circuit-under-test that is at least partially scan-based and a compactor for compacting test responses captured in the circuit-under-test. A transformation function performed by the compactor to the test responses captured in the circuit-under-test is determined. A diagnostic procedure for evaluating uncompressed test responses is modified into a modified diagnostic procedure that incorporates the transformation function therein. The modified diagnostic procedure can be an effect-cause diagnostic procedure and may comprise the acts of receiving a failure log of failing test responses observed in the circuit-under-test; identifying sets of fault candidates in logic cones associated with respective ones of the failing test responses, and determining an intersection between the sets of fault candidates.

In another disclosed method, a circuit description is received that describes a circuit-under-test that is at least partially scan-based and a compactor for compacting test responses captured in scan cells of the circuit-under-test. In this embodiment, the scan cells in the circuit-under-test described are located upstream of the compactor. A transformation function performed by the compactor to the test responses captured in the scan cells of the circuit-under-test is determined. The circuit description is modified to remove the compactor and embed the transformation function upstream of the scan cells in the circuit-under-test, thereby replacing the scan cells with pseudo-scan-cells. The disclosed method may further comprise performing diagnostics using the modified circuit description, the diagnostics being performed using a diagnostic procedure for evaluating uncompressed test responses.

Any of the disclosed methods may be implemented as computer-readable media comprising computer-executable instructions for causing a computer to perform the method. Further, computer-readable media comprising lists of fault candidates identified by any of the disclosed methods or circuit descriptions created or modified by the disclosed methods are also disclosed. Circuits having faults that were repaired by any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 5 is a flow chart of a first embodiment of a general fault diagnostic procedure for diagnosing faults from compacted test responses. In the embodiment illustrated in FIG. 5, a modified diagnostic procedure is used.

FIG. 6 is a flow chart of an exemplary embodiment of a modified diagnostic procedure as may be utilized by the exemplary procedure shown in FIG. 5. Specifically, FIG. 6 shows a modified version of the effect-cause diagnostic procedure from FIG. 1.

FIG. 8 is a flow chart of a second embodiment of a general fault diagnostic procedure for diagnosing faults from compacted test responses. In the embodiment illustrated in FIG. 5, a modified circuit description is used.

DETAILED DESCRIPTION

Figure 1:
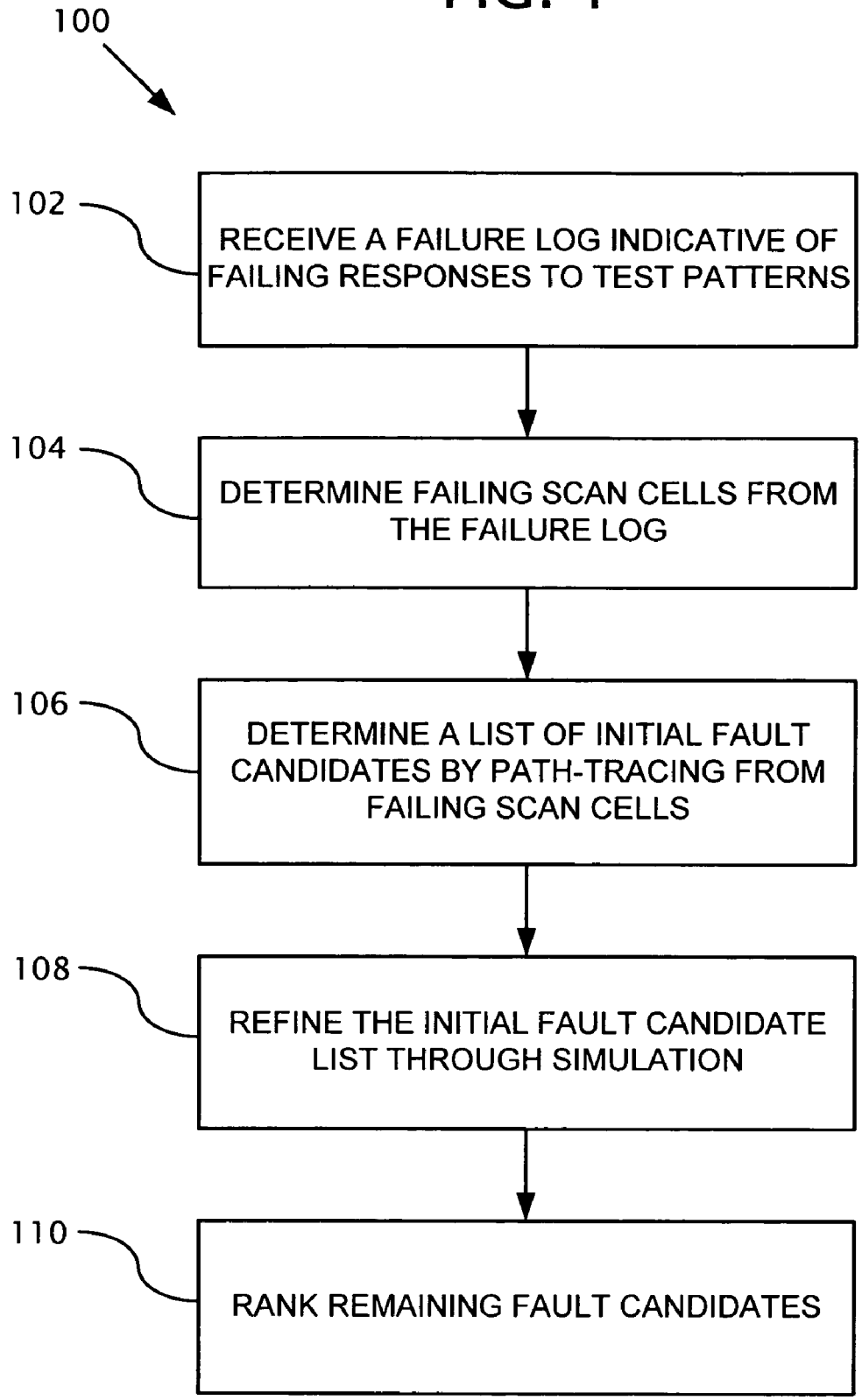
FIG. 1 is a flow chart of an exemplary embodiment of an effect-cause diagnostic procedure.

Disclosed below are representative embodiments of methods, apparatus, and systems for performing fault diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with a wide variety of scan-based or partially-scan-based circuits and can incorporate a wide variety of diagnostic procedures (e.g., effect-cause-based procedures utilizing structural pruning techniques and/or backward path-tracing techniques, which may be modified by various measures). Further, the fault candidates identified need not be of a particular type, but can vary from implementation to implementation (e.g., stuck-at faults, transition faults, bridging faults, and other faults). For illustrative purposes only, however, many of the examples described herein are explained in the context of utilizing an embodiment of an effect-cause algorithm and are used to diagnose stuck-at faults.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software may comprise, for example, electronic design automation (EDA) software (e.g., an automatic test pattern generation (ATPG) tool) used to diagnose test results captured during production testing of one or more integrated circuits (e.g., an application specific integrated circuit (ASIC), a programmable logic device (PLD) such as a field-programmable gate array (FPGA), or a system-on-a-chip (SoC) having digital, analog, or mixed-signal components thereon). This particular software implementation should not be construed as limiting in any way, however, as the principles disclosed herein are generally applicable to other software tools. Circuit faults that are detected using the disclosed techniques may in some circumstances be repaired.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. Any of the disclosed methods can alternatively be implemented (partially or completely) in hardware (e.g., an ASIC, PLD, or SoC).

Further, diagnostic results produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. For example, a list comprising fault candidates produced by the application of any of the disclosed embodiments may be stored on computer readable-media. Such diagnostic results can be created or updated at a local computer or over a network (e.g., by a server computer).

General Considerations

Compression techniques are often used in connection with the testing of integrated circuits. Such techniques are typically implemented by inserting some hardware block (which is termed generally a "compactor" for purposes of this disclosure) along the scan path on the output side of a scan-based or partially-scan-based circuit-under-test. The compactor block compresses the data captured in the internal scan chains of the circuit-under-test, thereby producing a data stream of compacted test responses that is output on a few scan-output channels for comparison with expected values (e.g., by automated test equipment (ATE)).

In general, compactors can be divided into three categories: (1) space compactors; (2) infinite input response compactors; (3) and finite input response compactors. Space compactors comprise combinational circuits that generate c test outputs from C outputs of the circuit under test (CUT), where c<C. Space compactors can ordinarily handle unknown states in test responses without any functional logic modification. Examples of space compactors include the so-called "EDT compactor" described in J. Rajski, M. Kassab, N. Mukherjee, N. Tamarapalli, J. Tyszer, and J. Qian, "Embedded Deterministic Test for Low-Cost Manufacturing," *IEEE Design & Test of Computers*, Vol. 20, Issue 5, pp. 58-66 (September-October 2003), and the so-called "X-Compactor" described in S. Mitra and K. S. Kim, "X-Compact: An Efficient Response Compaction Technique for Test Cost Reduction," *Proc. ITC* 2002, pp. 311-320, (2002). A second class of compactors—the infinite input response compactors—utilize polynomial division, counting-based techniques, and check-sum-based methods. Such compactors are typically used in built-in self-test (BIST) applications. Examples of such compactors are described in P. H. Bardell, W. H. McAnney and J. Savir, "Built-in Self-Test for VLSI: Pseudorandom Techniques," John Wiley & Sons (1987). A third class of compactors can be generally classified as finite input response compactors, which are characterized as having memory but no feedback. Consequently, any error or unknown state that is injected into the compactor is shifted out after some number of cycles. An example of a finite input response compactor is the so-called "convolutional compactor" described in J. Rajski, J. Tyszer, C. Wang, and S. M. Reddy, "Convolutional Compaction of Test Reponses," Proc. ITC 2003, pp. 745-754 (2003).

Diagnostic procedures used to analyze circuit responses to test patterns can also be classified into different categories. Two major categories of diagnostic procedures are: (1) cause-effect methods (that is, methods based on cause-effect principles); and (2) effect-cause methods (that is, methods based on effect-cause dependencies). Cause-effect methods typically build a simulation-response database for modeled faults and compare observed failing responses to the database in order to determine the probable cause of the failure. This type of method is often referred to as the "fault dictionary" method, as it requires a large fault-behavior database to be created, stored, and maintained. This method can provide good resolution for assumed fault models whose defect behavior is similar to the modeled fault behavior. For large designs, however, this approach is impractical due to memory constraints in the tester.

Effect-cause methods generally involve analyzing the actual circuit response to a test pattern in order to determine which fault(s) might have caused the observed failure. The analysis can be performed, for example, by backward path tracing from the scan cells and/or primary outputs of the circuit-under-test where faulty behaviors are observed. The error-propagation paths for possible fault suspects can then be identified. Compared to methods based on cause-effect principles, methods based on effect-cause dependencies are generally more memory-efficient and are better able to handle larger designs.

FIG. 1 is a flow chart illustrating an exemplary effect-cause procedure 100 as may be used to analyze test responses to a circuit-under-test having no compaction hardware. The exemplary effect-cause method 100 may be utilized as the underlying diagnostic procedure for the methods described below, which are capable of diagnosing faults in compactor-based designs without being limited to any particular compactor.

At process block 102 of FIG. 1, information indicative of a circuit-under-test's response to one or more test patterns is received. Typically, this information comprises test responses that are captured in scan cells of the circuit-under-test (CUT) and that are clocked out through scan-out pins. The information received may be a complete record of a test session (e.g., a record of all responses to one or more test patterns) or some portion thereof (e.g., a record of just the failing responses to one or more test patterns). Such information is typically stored in a failure log (or fail log) on the tester, which may then be transferred to another system for diagnosis or may be diagnosed directly by the tester. From the information received, the scan cells within the CUT that captured the failing responses can be determined. For purposes of this discussion, these scan cells are termed "failing scan cells."

At process block 104, one or more failing scan cells are identified from the failing responses listed in the failure log. For a circuit design having no compactor, the failing responses in the failure log can be directly correlated with failing scan cells.

At process block 106, an initial list of fault candidates is identified. The fault candidates comprise the physical locations in the CUT that might contain a physical defect that caused the failing response to appear downstream. To identify the fault candidates, a path-tracing technique can be used. For example, the path-tracing algorithm described in S. Venkataraman and W. K. Fuchs, "A Deductive Technique for Diagnosis of Bridging Faults," Proc. IEEE ICCAD, pp. 562-67 (1974) can be used. This particular path-tracing algorithm, however, is not limiting, as there exist many path-tracing algorithms that are suitable for use in the method 100. The path-tracing technique analyzes a representation of the CUT (e.g., a netlist or HDL file) and identifies the instances of logic (and possibly other circuit components) that at least partially contribute to the test response captured in each failing scan cell. For purposes of this disclosure, the components of the CUT that contribute to the value captured at a respective scan cell are referred to as that scan cell's "logic cone," which has a so-called "fan-in region" that leads to the scan cell.

Figure 2:
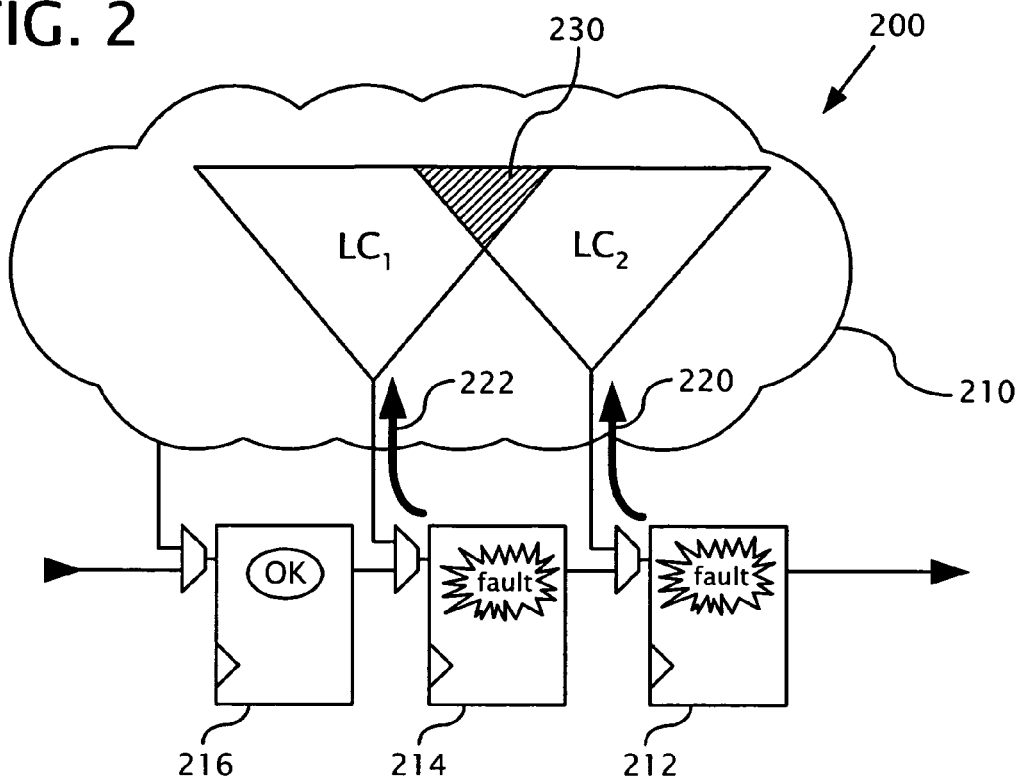
FIG. 2 is a block diagram illustrating an embodiment of the act of path-tracing into logic cones associated with failing scan cells such as in process block 106 of FIG. 1.

FIG. 2 is a schematic block diagram 200 illustrating an exemplary process block 106 of FIG. 1. In FIG. 2, circuit logic 210 of a CUT receives test-pattern values during a launch phase of testing, thereby producing test responses at three respective scan cells 212, 214, 216. For illustrative purposes only, assume that scan cells 214 and 212 capture failing test response (sometimes referred to herein as "failure responses" or "observed failure responses") after application of an exemplary test pattern.

At process block 106, logic cones $LC_1$ and $LC_2$ are identified from the failing scan cells 214, 216 using the path-tracing technique (represented by arrows 220, 222). In certain embodiments of the method 100, only fault candidates in the intersection 230 are included in the list of initial fault candidates, as it is assumed in such embodiments that both of the failing test responses were caused by a single fault in the CUT. Therefore, having identified the logic cones $LC_1$ and $LC_2$, an intersection 230 between the logic cones can be determined. In some implementations of the diagnostic procedure, an additional determination is made (e.g., during path tracing) as to whether sensitization paths exist from the fault candidates to all of the faulty scan cells for the failing pattern. If not, then the fault candidates are removed from the list. The remaining fault candidates form the initial fault candidate list.

At process block 108, the initial fault candidate list is refined through simulation. For example, according to one exemplary implementation, simulations of the circuit-under-test are performed wherein each fault from the initial list of candidate faults is injected into the simulator's representation of the circuit and application of one, some, or all of the failing test patterns is simulated. From these simulations, a determination can be made as to which fault candidates match the actual response recorded in the failure log. The matching fault candidates are those that propagate the observed faulty effect to the failing scan cells (and/or the observed failing primary outputs), but not to any other observation point (e.g., other scan cells or primary outputs) upon application of the corresponding test pattern. In certain embodiments, the speed of the simulation may be increased using, for example, parallel-pattern single-fault propagation techniques (PPSFP), which allow for multiple failing patterns (e.g., 32 patterns) to be processed in parallel.

In some embodiments, certain weighted criteria may be used during process block 108. For example, according to one particular implementation, a first weighted value $w_f$ can be used to indicate the number of failing patterns a fault candidate can explain. The value of $w_f$ (which initially can be zero) can be increased by one for each failing test pattern the corresponding fault explains. In certain embodiments, fault candidates having a value of $w_f$ that is still equal to zero after simulation are removed from the list of fault candidates.

Figure 3:
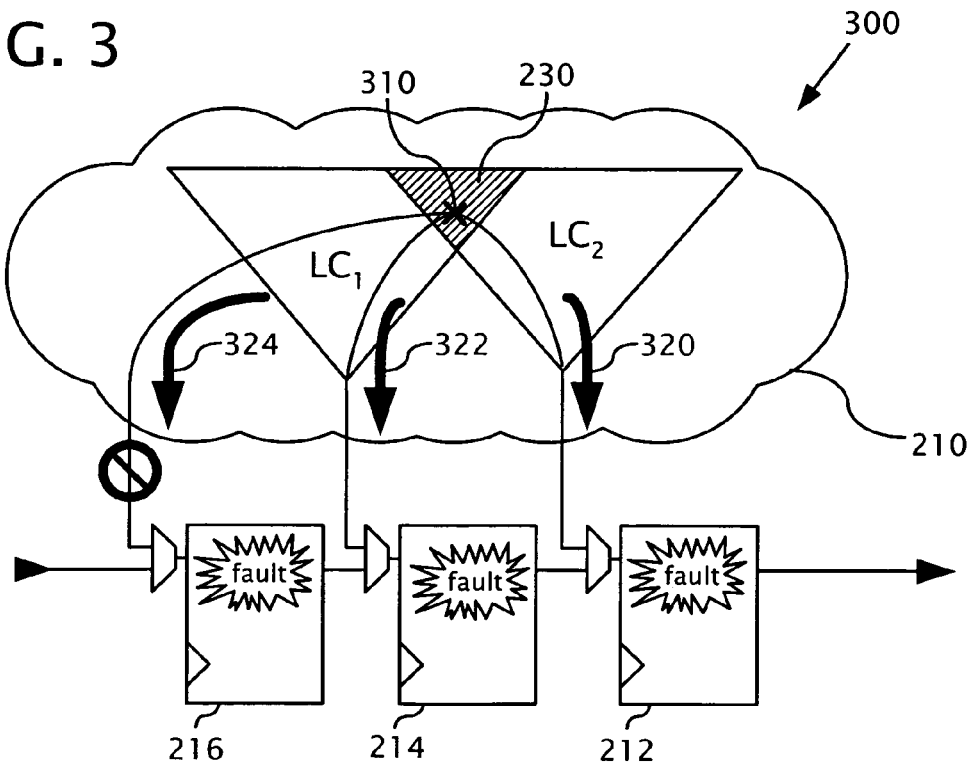
FIG. 3 is a block diagram illustrating an embodiment of the act of simulating faults in a representation of the circuit in order to refine the list of initial fault candidates, such as in process block 108 of FIG. 1.

FIG. 3 is a schematic block diagram 300 illustrating the forward simulation of fault candidates that occurs at process block 108. In particular, FIG. 3 illustrates the forward simulation (denoted by arrows 320, 322, 324) of the circuit logic 210 when a failing test pattern is applied in the presence of a selected fault 310 from the initial list of fault candidates. In the illustrated example, the selected fault 310 produces an unexpected response at scan cell 216, as well as the expected responses at scan cells 212, 214. Accordingly, in this example, the selected fault 310 does not explain the observed test response, and, in certain embodiments, the first weighted value $w_f$ will not be increased. In some embodiments, if the simulated test pattern is the test pattern that produced the test response used to identify the fault candidate, then the fault candidate is removed from the list of candidates unless it produces a simulated test response identical to the actual test response.

At process block 110, the remaining fault candidates are ranked. In some embodiments of the method 100, for example, additional simulations are performed to help further refine the list of candidate faults. For instance, one or more passing test patterns can be simulated in the presence of each of the fault candidates in order to calculate a second weighted value $w_g$. In one particular implementation, the value of $w_g$ is increased by one for each successful test pattern that the fault candidate explains. The first weighted value $w_f$ and the second weighted value $w_g$ may then be used to rank the remaining candidates. For example, a combined weight utilizing both $w_f$ and $w_g$ may be calculated using the following equation:

$$(\alpha w_f + (1-\alpha) w_g) \tag{1}$$

where $\alpha$ is a real number between "0" and "1." Using the list of ranked candidates, physical inspections of the circuit-under-test can be performed, and, in many instances, the fault repaired.

Compactor Modeling Generally

One of the techniques that may be utilized in embodiments of the disclosed technology is compactor modeling. A typical scan-based or partially-scan-based design-for-test (DFT) circuit uses a plurality of scan chains that feed into the compactor. For each test pattern launched in the circuit-under-test, test responses of "1," "0," or "X" (unknown bits) are captured into scan cells of the scan chain and shifted into the compactor. Each bit of the test response after compaction (denoted generally as $P_i$, where i is an index value that increases incrementally for each value output from the compactor) can be expressed as a function of a set of values that are captured into the scan cells before compaction. For any given compactor, there exists a unique set of equations that represents the relationships between the values observed after compaction and the values captured into the scan cells before compaction. As used herein, this relationship is defined by the "transformation function" and is denoted as $\Phi_i$ such that $P_i = \Phi_i(C_i)$ where $C_i$ is the corresponding set of logic cones that determine the test responses captured in scan cells before compaction. The cumulative set of transformation functions $\Phi_i$ representative of all values output from the compactor can be denoted by the general transformation operator $\Phi$. This particular form of notation should not be construed as limiting, however, as the transformation function can be described or denoted in a variety of different ways. For example, the transformation function of a particular compactor can be described as a set of matrices denoting the test responses before and after compaction. The exact values of $\Phi_i$ may be determined by the compactor architecture present in the circuit design and will vary from design to design. Further, in some compactor architectures (e.g., infinite input response compactors), the transformation function will vary over time (e.g., each time the compactor is clocked).

Figure 4A:
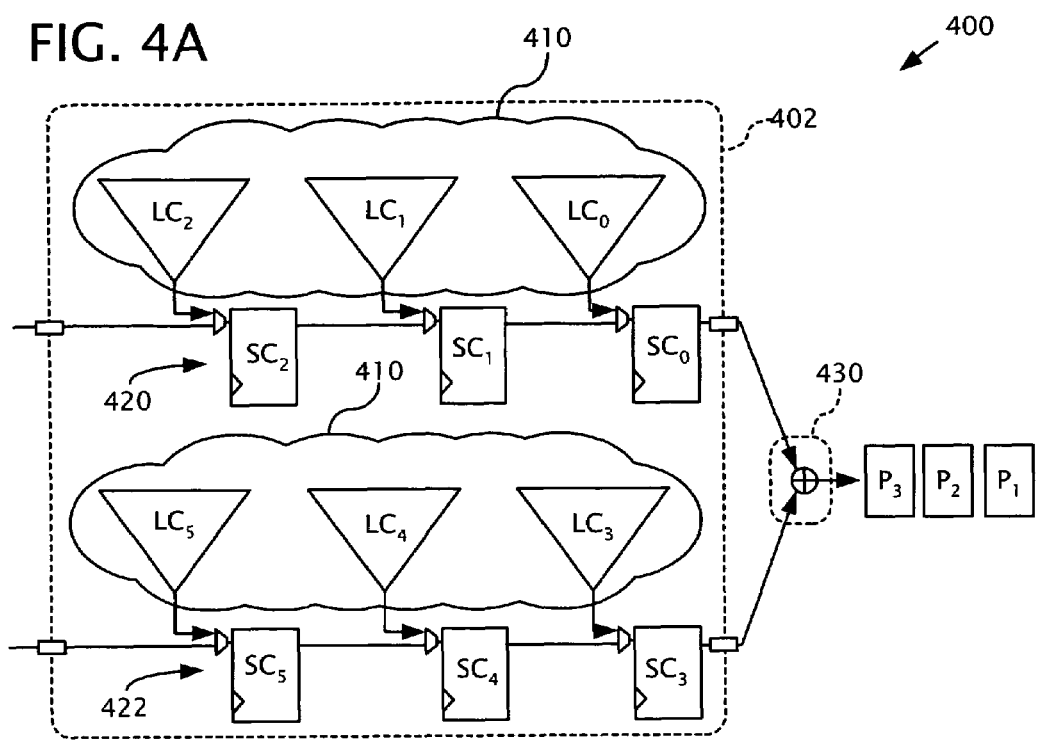
FIG. 4A is a block diagram of an exemplary scan-based circuit-under-test configured to capture test responses in scan cells and output the test responses to a compactor.
Figure 4B:
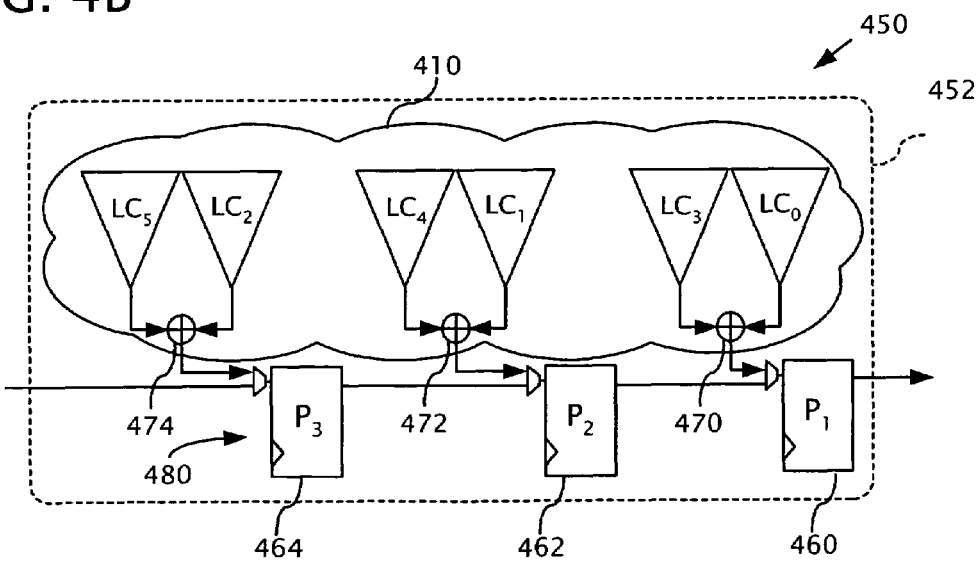
FIG. 4B is a block diagram illustrating an example of how the circuit-under test from FIG. 4A can be transformed such that the transformation function performed by the compactor is performed upstream of the original scan cells.

FIGS. 4A and 4B are block diagrams 400 and 450, respectively, that illustrate conceptually how the transformation function $\Phi$ can be applied to a circuit-under-test 402. The circuit-under-test 402 comprises logic 410 wherein six logic cones ($LC_0$ through $LC_5$) feed six exemplary scan cells ($SC_0$ through $SC_5$). Scan cells $SC_0$ through $SC_2$ form a first scan chain 420, whereas scan cells $SC_3$ through $SC_5$ form a second scan chain 422. In this example, the first and second scan chains 420, 422 output into a compactor 430, which, for illustrative purposes only, is assumed to be an XOR gate (as may be used, for example, in a space compactor, such as the EDT compactor). The compacted test responses ($P_1$ through $P_3$) are output from the compactor 430 (e.g., through a scan-out pin). Thus, in FIG. 4, the transformation function $\Phi$ corresponds to the XOR function, which is universally applied in this specific example during every clock cycle of the illustrated compactor 430. Thus, for compacted test responses $P_1$ through $P_3$, the compactor can be modeled as follows:

$$P_1 = (0 \oplus 3),$$

$$P_2 = (1 \oplus 4), \text{ and}$$

$$P_3 = (2 \oplus 5), \tag{2}$$

where $\oplus$ corresponds to the XOR function, and the numerals represent the test responses produced by the corresponding logic cones (e.g., "0" represents the response produced by logic cone $LC_0$).

The transformation function can also represent a more general relationship between compacted test responses and the respective logic cones that at least partially contribute to them (that is, the representation does not need to specifically model the Boolean function performed by the compactor). In this example, for instance, the transformation function can be described as follows:

$$P_1 = \Phi_1(\{0, 3\}),$$

$$P_2 = \Phi_2(\{1, 4\}), \text{ and}$$

$$P_3 = \Phi_3(\{2, 5\}), \tag{3}$$

where the numerals represent the logic cones that produce the test responses compacted via the function $\Phi_i$ (e.g., "0" represents logic cone 0 and the test response it produces).

A representation of the circuit-under-test 402 can be modified so that the transformation function $\Phi$ is embedded in the transformed circuit. The resulting modified circuit can be viewed as one having no compactor, and having "pseudo-scan-chains" and "pseudo-scan-cells" instead of scan chains and scan cells. An exemplary modified circuit representation 452 is shown in FIG. 4B. The modified circuit representation 452 is logically identical to the circuit-under-test 402 with the compactor 430, but the original internal scan chains 420 and 422 are replaced by one pseudo-scan-chain 480 and the original internal scan cells SC0 through SC5 are replaced by three pseudo-scan-cells 460, 462, 464. In addition, the transformation function Φ performed by the compactor 430 is moved upstream of the pseudo-scan-cells 460, 462, 464. In the illustrated example, for instance, three XOR gates 470, 472, 474 are inserted into the circuit-under-test 410 and output into three pseudo-scan-cells 460, 462, 464, which capture the values $P_1$ through $P_3$.

Exemplary Embodiments for Diagnosing Faults from Compacted Test Responses

There are multiple ways in which the transformation function Φ or a transformed circuit can be utilized as part of an overall diagnostic procedure for scan-based or partially-scan-based designs having compacted test results. Two exemplary methods are shown generally in FIGS. 5 and 6, respectively.

Modifying the Diagnostic Procedure

FIG. 5 is a flow chart illustrating a first general embodiment for performing fault diagnosis on compacted test results in which the diagnostic procedure itself is modified. The method 500 shown in FIG. 5 can be applied to a wide variety of different compaction schemes and can utilize a variety of existing diagnostic algorithms. Further, embodiments of the method 500 can perform on-line diagnosis and/or account for multiple errors captured in a test response and output during a single scan-out cycle.

At process block 502, a description of a scan-based or partially-scan-based circuit and a compactor is received. The description may be a circuit design file as is commonly used in the EDA industry (for example, the description may be a netlist or a hardware description language (HDL) file, such as a VHSIC Hardware Description Language (VHDL) file or Verilog file).

At process block 504, at least a portion of the transformation function Φ performed by the compactor in the circuit description is determined. This determination can be made mathematically or empirically using, for example, a logic simulation of the circuit and compactor.

At process block 506, a diagnostic procedure for diagnosing uncompacted test responses is modified such that the transformation function is incorporated into the procedure. As a result of determining the transformation function at process block 504 (e.g., the transformation function $\Phi_i$ for at least a portion of the compacted test responses), a relationship between a compacted test response $P_i$ and the logic cones that may have contributed to the test responses (the "candidate logic cones") is known. The diagnostic procedure can be modified to account for this relationship, such that the additional acts performed in the procedure assume that all of the candidate logic cones related to a failing test response $P_i$ via the transformation function are to be analyzed. An example of this process is described in greater detail below with reference to FIG. 6.

At process block 508, the modified diagnostic procedure is applied to compacted test responses. For instance, the modified diagnostic procedure can be applied to the failures recorded in a failure log from a tester after applying test patterns to a circuit-under-test and having the test responses compacted by a compactor.

Exemplary Embodiments of a Modified Diagnostic Procedure

Figure 7A:
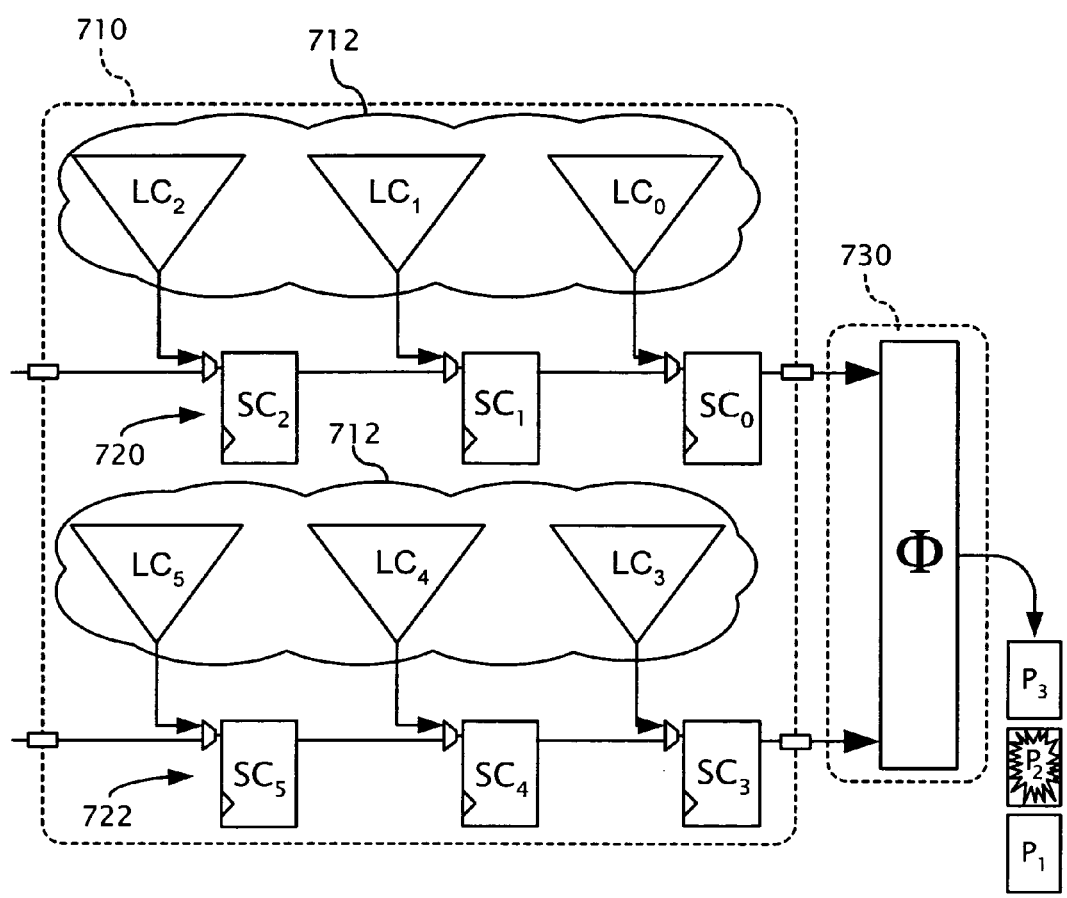
FIGS. 7A-7C are block diagrams illustrating how an embodiment of the method shown in FIGS. 5 and 6 can be applied to an exemplary scan-based circuit-under-test.

An exemplary application of the general method 500 is shown with reference to FIGS. 6, 7A, 7B, and 7C. In FIG. 7A, an original circuit 710 comprises logic 712 having six logic cones $LC_0$ through $LC_5$ that feed six respective internal scan cells $SC_0$ through $SC_5$. The outputs of the two scan chains 720, 722 are coupled to the inputs of a compactor 730, which performs compaction according to some compaction function Φ and produces exemplary compacted test responses $P_1$ through $P_3$. Although not illustrated in FIG. 7A, different logic cones may have some common logic among them (that is, two or more of the logic cones may at least partially intersect). In such a scenario, faults from the intersecting logic can propagate to multiple scan cells, even to scan cells that are output during the same scan-out cycle.

With reference to the general method 500, at process block 502, a description of the original circuit 710 and compactor 730 (e.g., a netlist or HDL file) is received. At process block 504, the compaction function performed by the compactor 730 is determined. For example, the compactor 730 can be modeled as a function $\Phi_i$, such that $P_i = \Phi_i(C_i)$. Conceptually, the observed fault responses $P_i$ can be viewed as being captured in the $i^{th}$ pseudo-scan-cell (i=1, 2, 3, as in the pseudo-scan-cells 460, 462, 464 illustrated in FIG. 4B), and $C_i$ is a set of logic cones that at least partially determine the value at the corresponding pseudo-scan-cell. A logic cone $LC_j$ appears in set $C_i$ if it is at least partially determinative of the corresponding compacted test response $P_i$. At process block 506, the diagnostic procedure is modified to at least partially incorporate the transformation function Φ, thereby allowing the procedure to be applied to the failing responses observed by the compactor. At process block 508, the modified diagnostic procedure is applied to the compacted test responses (e.g., to the responses recorded in a failure log from a tester).

FIG. 6 illustrates how a typical effect-cause diagnostic procedure can be modified at process block 506 and applied at process block 508 of the general method 500. Unless otherwise stated, the method illustrated in FIG. 6 is substantially similar to the effect-cause procedure 100 outlined above with respect to FIG. 1, except that the method of FIG. 6 operates on compacted results. For purposes of this example, assume that the design of the original circuit-under-test is as shown in FIG. 7A and described above, and that the transformation function of the compactor has the following general relationship:

$$P_1 = \Phi_1(\{0, 1, 2, 3\}),$$

$$P_2 = \Phi_2(\{0, 4\}), \text{ and}$$

$$P_3 = \Phi_3(\{2, 4, 5\}), \quad (4)$$

where the numerals represent the logic cones that produce the test responses compacted via the function $\Phi_i$ (e.g., "0" represents logic cone 0 and the test response it produces).

At process block 602, a failure log indicative of the failing responses to one or more test patterns in a circuit-under-test is received (e.g., from a tester). For purposes of the example illustrated in FIGS. 7A-7C, assume that a failure is observed in compacted test response $P_2$.

At process block 604, initial fault candidates for the failing responses are determined by path-tracing into logic cones of the circuit-under-test identified using the transformation function. In this example, for instance, the relationship between the compacted test response $P_2$ and the candidate logic cones contributing to the test response is given by $P_2 = \Phi_2(\{0,4\})$, which can be used to identify the logic cones $LC_0$ and $LC_4$ as the logic cones that should be path traced for fault candidates. Note that the relationship need not specifically identify the actual function of the compactor (e.g., an XOR function), only the potential logic cone sources that at least partially determine the compacted test response. Thus, it is not necessary to calculate or use a reverse function $\Phi^{-1}$ in order to identify failing scan-cell candidates; instead, the relationship Φ can be applied to the compressed test responses and used to directly identify the logic cone candidates wherein a potential fault might exist. Further, no assumption concerning the number of failing scan cells that are output during a single scan-out cycle needs to be made, thereby maximizing the solution space of possible fault candidates. According to one exemplary implementation, for instance, the initial fault candidate list comprises all faults identified in the union of logic cones $C_i$ as given by the relationship $P_i = \Phi_i(C_i)$ for a given failing response $P_i$.

Figure 7B:
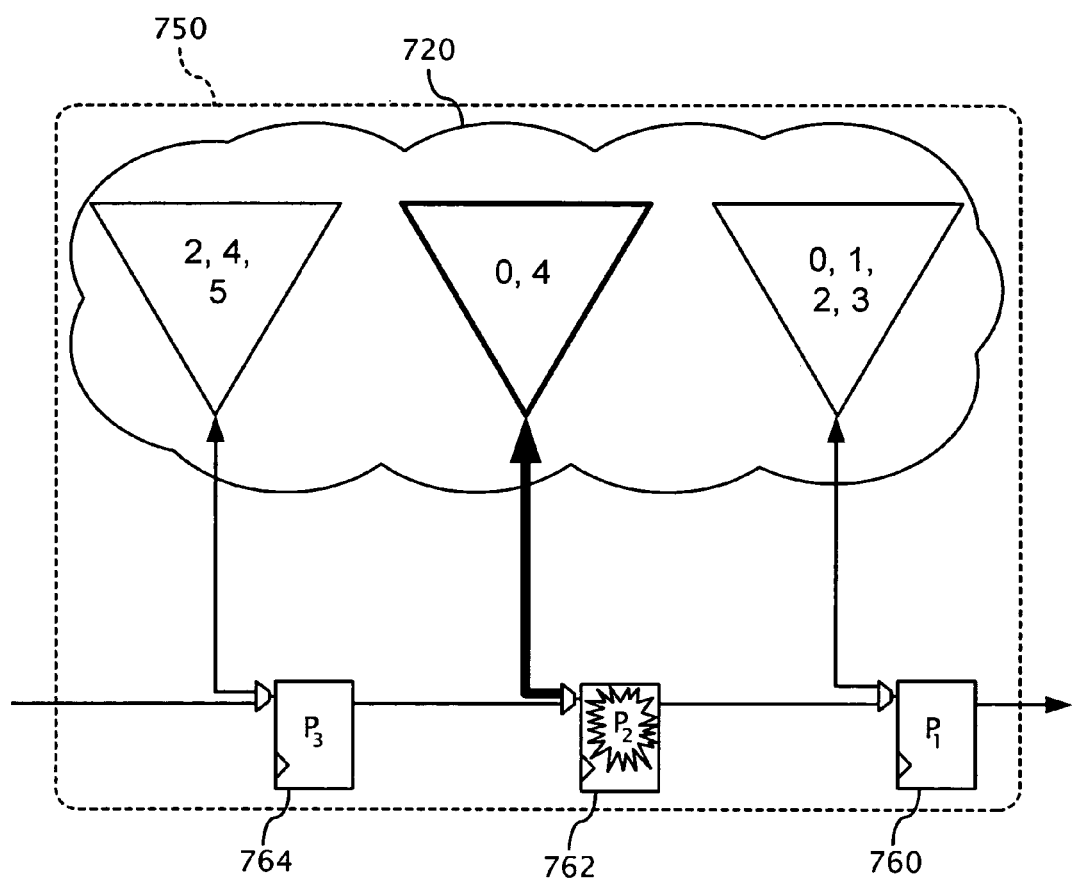

A conceptual representation of a transformed circuit-under-test 750 during this method act is shown in FIG. 7B. Specifically, FIG. 7B shows pseudo-scan-cells 760, 762, 764, which correspond to the compacted test responses $P_1$ through $P_3$ from the original compactor 730. As a result of the compactor modeling described above, it is known that the value at each of the pseudo-scan-cells 760, 762, and 762 must be at least partially determined by the following respective unions of logic cones: $(LC_0 \cup LC_1 \cup LC_2 \cup LC_3)$, $(LC_0 \cup LC_4)$, and $(LC_2 \cup LC_4 \cup LC_5)$. Therefore, in one implementation, the initial fault candidates comprise all possible faults found during path tracing into the logic cone union $LC_0 \cup LC_4$. Note that in FIG. 7B and in the other figures of this disclosure, logic cone unions are denoted merely by the logic cone numbers in the union. Thus, the union of $LC_0 \cup LC_4$ is denoted as (0, 4).

If multiple failing responses Pi are captured in scan cells upon application of a single test pattern, the list of initial fault candidates can be narrowed down by considering only those fault candidates that intersect between respective candidate lists. An example of this narrowing procedure is described below with reference to FIGS. 9 and 10.

Returning to FIG. 6, at process block 606, the list of initial fault candidates is refined through simulation of the transformed circuit-under-test, wherein the simulation is adapted to incorporate the transformation function. For example, in one exemplary implementation, each fault in the suspect list is injected into the circuit and simulated. During simulation in this implementation, the transformation function is accounted for. Typically, this is done by using a mathematical function during the simulation (e.g., by calculating compacted test responses from respective captured scan cell values using the function $\Phi_i$), but may alternatively be performed by actually simulating the logic components of the compactor (e.g., using a circuit description that embeds the compactor upstream of pseudo-scan-cells). The results from the simulation at process block 606 are compared with the test responses observed and stored in the failure log. If the simulation results do not match with the actual observed results for the corresponding test pattern, then, in one implementation, the fault candidate is removed. In another implementation, all of the failing patterns are simulated for each fault candidate and a weighted criteria (such as the criteria described above with respect to FIG. 1) is utilized to evaluate how well the fault candidate explains the test responses for every failing pattern. In this implementation, if a fault candidate cannot explain the observed responses for any failing test pattern, it is removed from the list of fault candidates.

Figure 7C:
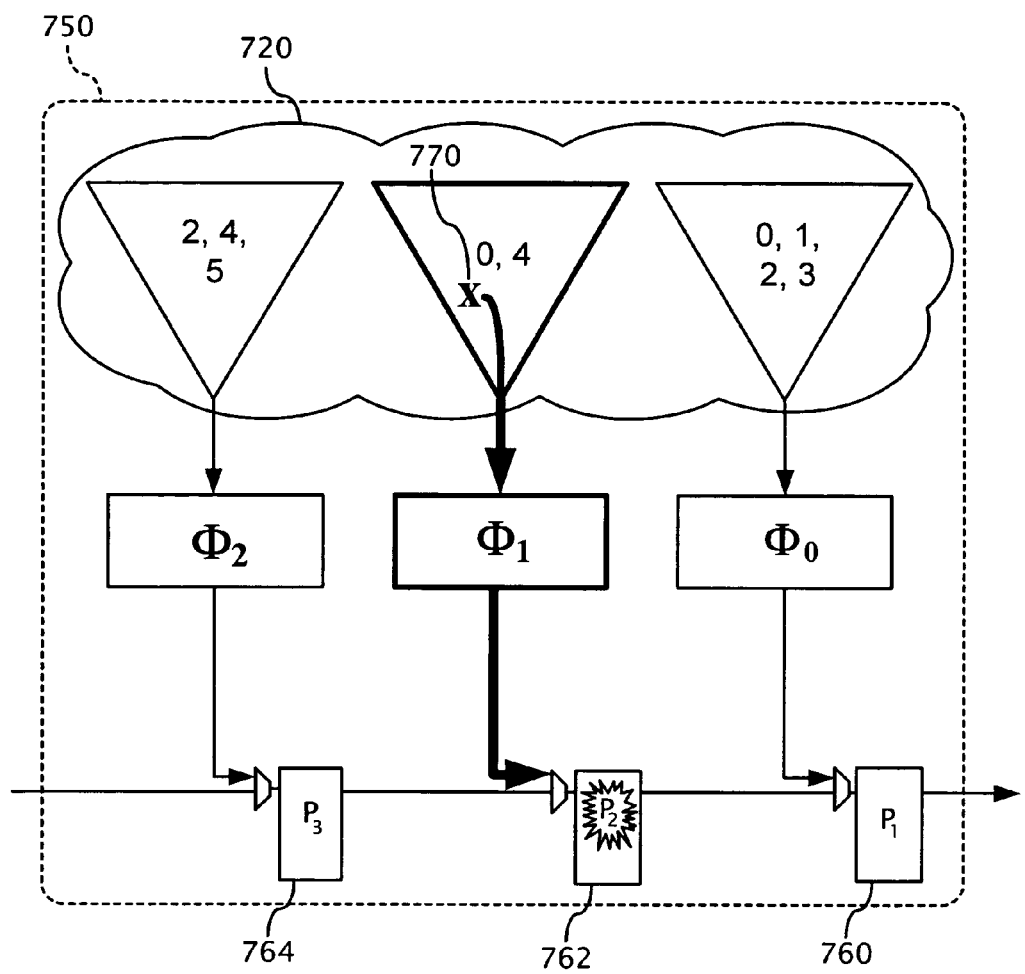

Forward simulation as may be performed at process block 606 is illustrated schematically in FIG. 7C, which shows a selected fault candidate 770 ("X") being propagated through logic cone union $LC_0 \cup LC_4$ during application of a test pattern (assumed for illustrative purposes to be the same test pattern applied when the corresponding failing test response was observed). In the illustrated simulation, the error caused by the fault candidate 770 is propagated to pseudo-scan-cell 762 (corresponding to $P_2$), but not pseudo-scan-cells 760 or 764 (corresponding to $P_1$ and $P_3$, respectively). (Note that in the forward simulation illustrated in FIG. 7C, the transformation functions $\Phi_1$, $\Phi_2$, and $\Phi_3$ are embedded into the simulation. That is, the functions $\Phi_1$, $\Phi_2$, and $\Phi_3$ are performed on the values output from the respective logic cones (0, 1, 2, 3), (0, 4), and (2, 4, 5), respectively). Accordingly, the fault candidate 770 produced the observed test response for the corresponding test pattern, and would remain on the list of fault candidates.

At process block 608, the remaining fault candidates are ranked. For example, any of the criteria used in known effect-cause diagnostic methodologies can be used.

Modifying the Circuit Description

FIG. 8 is a flow chart illustrating a second general embodiment for performing fault diagnosis according to the disclosed technology. The method 800 shown in FIG. 8 can be applied to a wide variety of different compaction schemes and can utilize a variety of existing diagnostic algorithms. Further, embodiments of the method 800 can perform on-line diagnosis and/or account for multiple errors captured in a test response and output during a single scan-out cycle.

At process block 802, a description of a scan-based or partially-scan-based circuit and a corresponding compactor is received (e.g., a netlist or HDL file). At process block 804 a transformation function performed by the compactor (e.g., Φ) is determined. At process block 806, the circuit description is modified so as to embed at least a portion of the compaction function upstream of one or more scan cells in the circuit. For example, the circuit description may be modified so that the compaction functions associated with selected scan cells are performed upstream of pseudo-scan-cells, but downstream of the respective logic cones that feed the pseudo-scan-cells. Consequently, one or more scan cells from the original circuit design are replaced by "pseudo-scan-cells" that capture test response values equivalent to the test responses values output from the compactor in the original circuit description. At process block 808, a diagnosis procedure for circuit designs having no compaction (e.g., one of the traditional effect-cause diagnostic procedures) is applied using the modified circuit description. In this embodiment, because the circuit description itself has been modified to embed the compaction function, no special modification of the diagnostic scheme is necessary (though modification is not necessarily excluded).

The general method 800 can be applied to any compactor that can be represented in terms of a transformation function Φ. Moreover, because the resulting circuit transformation results in a circuit description that inherently accounts for the compaction function, any appropriate diagnostic procedure for uncompacted test response can be utilized.

Exemplary Applications

In order to illustrate various features and aspects of the disclosed technology, the application of the exemplary compactor-independent diagnostic procedure described in FIGS. 5 and 6 is described as being applied to a variety of known compactors. Specifically, an embodiment of the disclosed procedure is described as it applies to: (1) an X-compactor; (2) a convolutional compactor; (3) an EDT compactor; and (4) an elementary-tree compactor;.

X-Compactor

The X-compactor is described in S. Mitra and K. S. Kim, "X-Compact: An Efficient Response Compaction Technique for Test Cost Reduction," *Proc. ITC* 2002, pp. 311-320 (2002). The X-compactor is a linear space compactor and generally comprises internal scan chain outputs connected to more than one XOR gate in an XOR tree.

Figure 9:
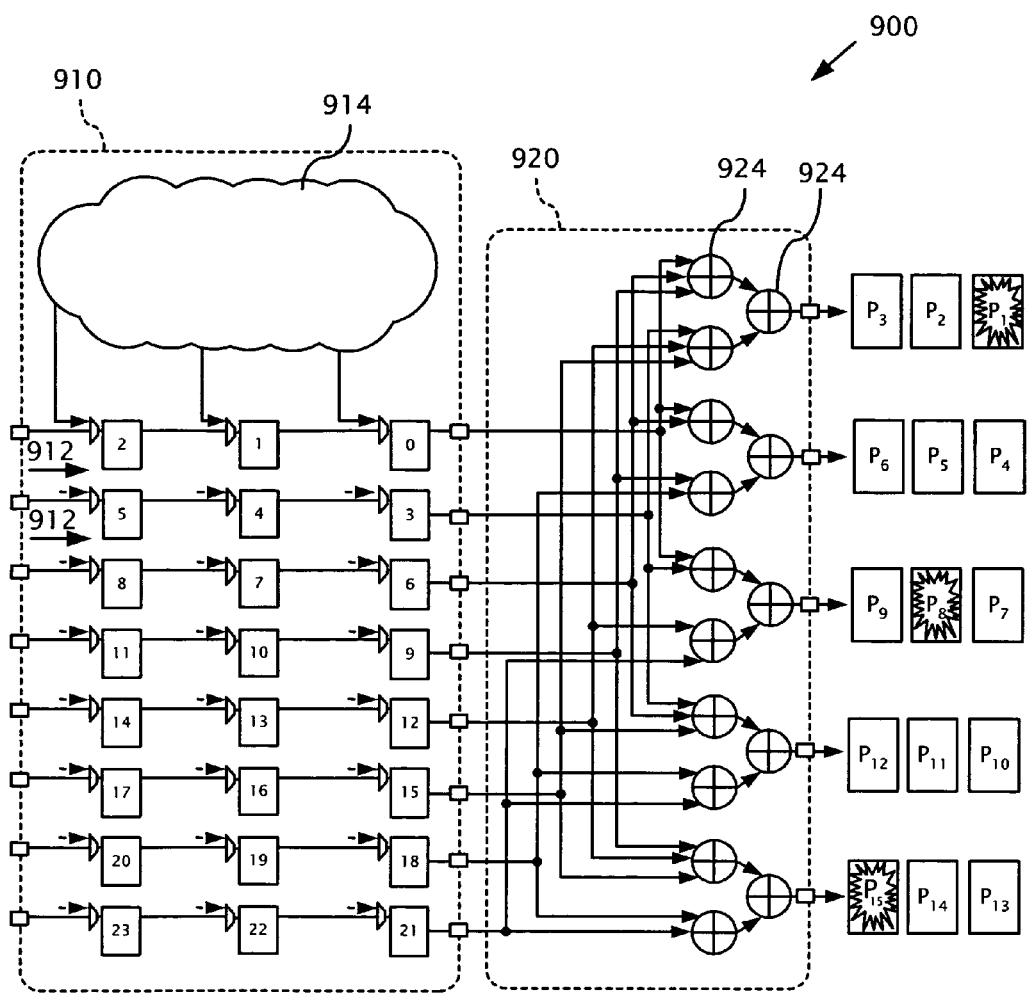
FIG. 9 is a schematic block diagram of an exemplary scan-based circuit-under-test coupled to an exemplary X-compactor.

FIG. 9 is a block diagram 900 schematically showing an exemplary circuit-under-test 910 having eight scan chains coupled to an exemplary X-Compactor 920. The circuit-under-test has eight scan chains 912 fed by logic 916 that output into the X-Compactor 920, which compacts the data from the scan chains into five outputs through an XOR tree comprises XOR gates such as the two indicated at 924 in FIG. 9. As shown in FIG. 9, each scan-chain output branches into three XOR gates of the tree in the compactor 920.

Using the diagnostic procedure described above with respect to FIGS. 5 and 6, a transformation function $\Phi$ can be determined that models the compactor 920 (process block 504). A failure log indicative of failing test responses is received (process block 602). For purposes of this example, assume that the failure log indicates that failures are present in three of the compacted test responses: $P_1$, $P_8$, and $P_{15}$. Using the transformation function $\Phi$, path-tracing can be performed into each logic cone associated with a corresponding failing compacted test response (or, equivalently, from each failing pseudo-scan-cell) to determine the initial fault candidates (process block 604). As can be verified from FIG. 9, the transformation functions of the compactor 920 for the three observed failing responses are as follows:

$$P_1 = \{(0 \oplus 6 \oplus 9) \oplus (3 \oplus 12 \oplus 15)\}$$

$$P_8 = \{(1 \oplus 4) \oplus (13 \oplus 22)\}$$

$$P_{15} = \{(11 \oplus 14 \oplus 17) \oplus (20 \oplus 23)\} \quad (5)$$

Or, written more generally so as to identify just the candidate logic cones:

$$P_1 = \Phi_1(\{0, 3, 6, 9, 12, 15\})$$

$$P_8 = \Phi_8(\{1, 4, 13, 22\}), \text{ and}$$

$$P_{15} = \Phi_{15}(\{11, 14, 17, 20, 23\}). \quad (6)$$

Figure 10:
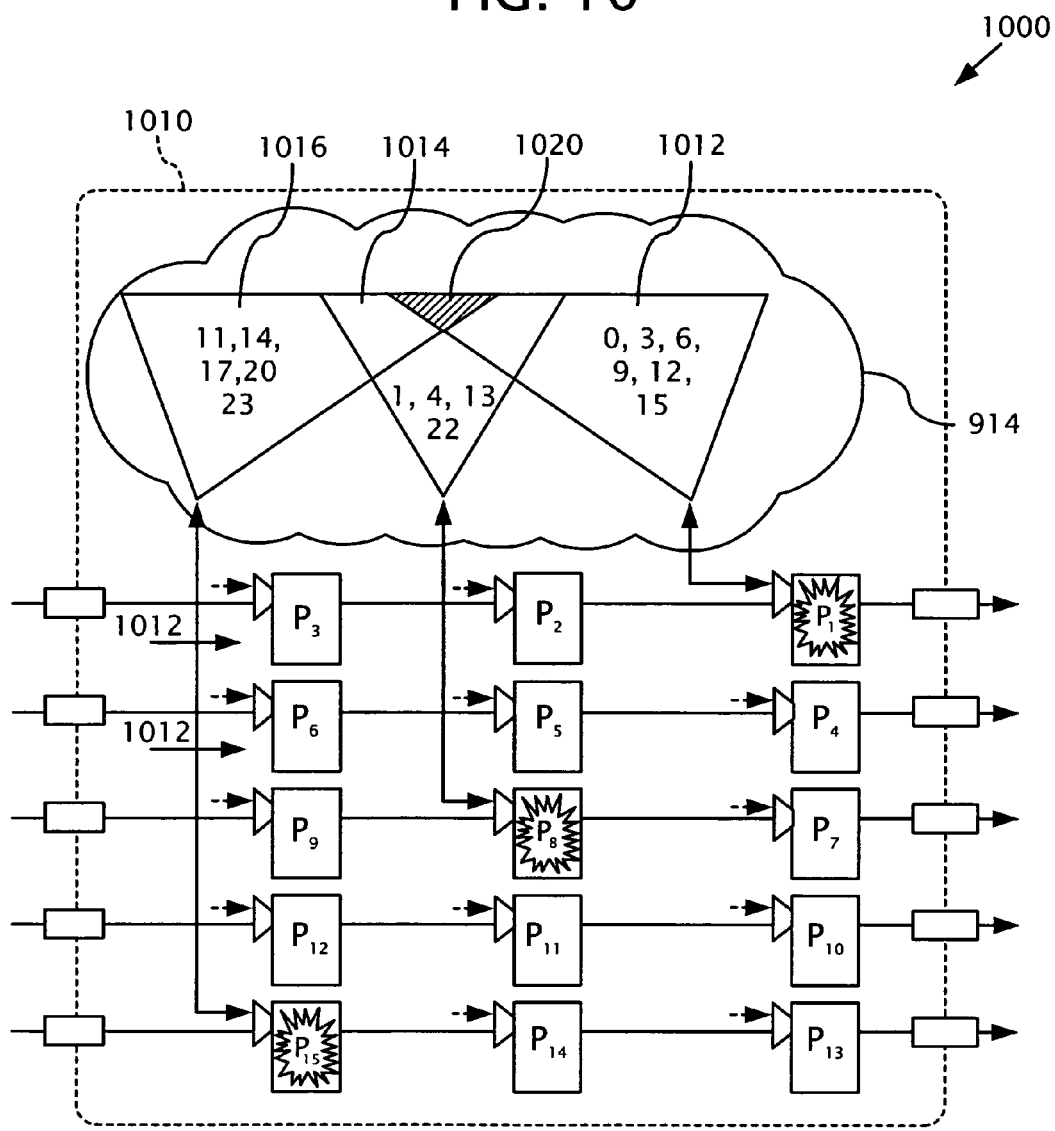
FIG. 10 is a schematic block diagram illustrating how an exemplary embodiment of the method shown in FIGS. 5 and 6 can be applied to the circuit-under-test and X-compactor from FIG. 9.

FIG. 10 is a schematic diagram 1000 conceptually illustrating a transformed circuit 1010. The transformed circuit 1010 represents the circuit-under-test 910 after it has been transformed to incorporate the transformation functions $\Phi_1$, $\Phi_8$, $\Phi_{15}$. As can be seen from FIG. 10, the transformed circuit 1010 has five pseudo-scan-chains 1012 (only two of which are number in FIG. 10) comprising pseudo-scan-cells ($P_1$ through $P_{15}$). From the transformation functions $\Phi_1$, $\Phi_8$, $\Phi_{15}$ given in Equation (6), it can be determined that the faults that led to the observed failure $P_1$ (or, equivalently, the value at pseudo-scan-cell $P_1$ in transformed circuit 1010) must have come from the logic cone union 1012 ($LC_0 \cup LC_3 \cup LC_6 \cup LC_9 \cup LC_{12} \cup LC_{15}$). Likewise, the faults that led to the observed failure at $P_8$ (or, equivalently, pseudo-scan-cell $P_8$ in FIG. 10) must have come from the logic cone union 1014 ($LC_1 \cup LC_4 \cup LC_{13} \cup LC_{22}$). Finally, the faults that led to $P_{15}$ (or, equivalently, pseudo-scan-cell $P_{15}$ in FIG. 10) must have come from the logic cone union 1016 ($LC_{11} \cup LC_{14} \cup LC_{17} \cup LC_{20} \cup LC_{23}$). In one implementation, the initial fault candidates comprise all faults in the logic cone unions 1012, 1014, 1016. However, in another implementation, it may be assumed that a single fault caused all of the failures observed for a particular test pattern. Thus, the list of initial fault candidates can be determined by finding the intersection of all of the logic cone unions. For example, the fault candidates within area 1020 in FIG. 10 comprise the fault candidates in the intersection of the three logic cone unions 1012, 1014, 1016. In still other implementations, the assumption that a single fault caused all of the failures for particular test pattern may be dependent on the location and/or number of the failures observed. Simulations of the test patterns in the circuit while injecting each fault in the list of initial fault candidates can be performed (process block 606). For each pattern simulated, the transformation function $\Phi$ can be applied in order to get simulated results that can be compared to the data in the failure log.

Using the illustrated diagnostic procedure, defects that cause multiple scan cells to capture errors that are output during the same scan-out cycle can be identified. By contrast, in some diagnostic methodologies, the assumption is made that only a single scan cell produces an error at any scan-out cycle so long as the other scan cells do not produce unknown values ("X" values). This assumption, however, implies that there is no intersection among logic cones that feed into scan cells that output during the same scan-out cycle. For example, consider the X-Compactor 920 illustrated in FIG. 9. Each internal scan chain 912 is connected to three compacter outputs. Thus, under the single-error assumption, three failed pseudo-scan-cells should be observed during any failed scan-out cycle. Accordingly, given the observed failures at $P_1$, $P_8$, and $P_{15}$, a procedure based on the single-error assumption would not be able to identify which internal scan cells captured the failures.

Convolutional Compactor

The convolutional compactor is described in J. Rajski, J. Tyszer, C. Wang, and S. M. Reddy, "Convolutional Compaction of Test Reponses," *Proc. ITC* 2003, pp. 745-754 (2003). The convolutional compactor is a finite input response compactor having memory elements that are typically reset after a signature is produced for a given test pattern.

Figure 11:
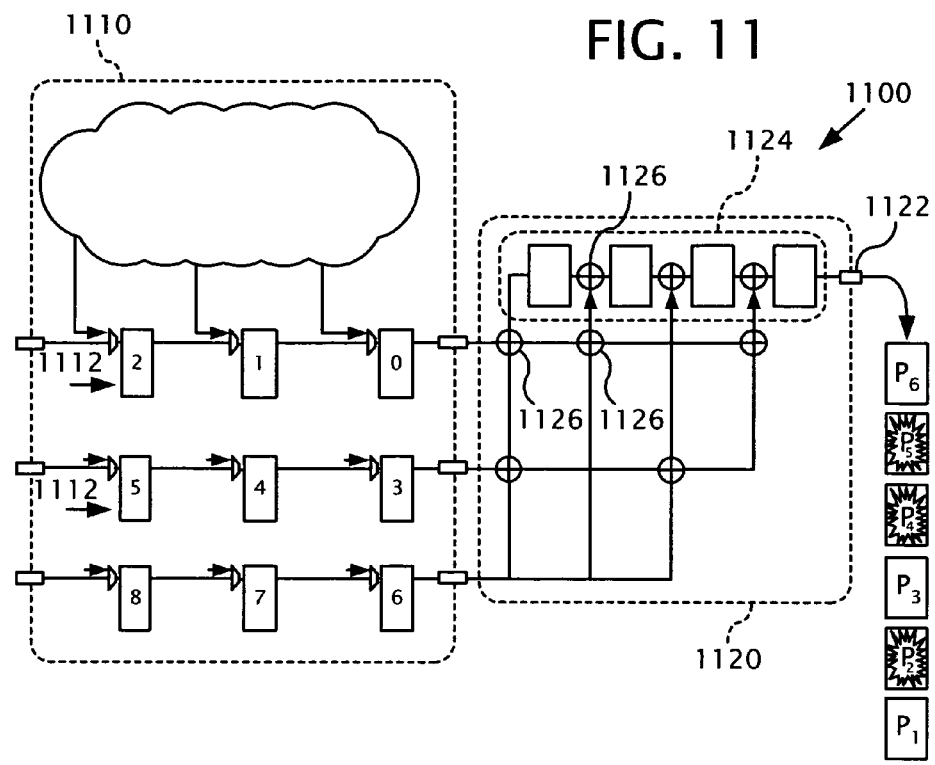
FIG. 11 is a schematic block diagram of an exemplary scan-based circuit-under-test coupled to an exemplary convolutional compactor.

FIG. 11 is a block diagram 1100 schematically showing an exemplary circuit-under-test 1110 having three scan chains 1112 (two of which are numbered in FIG. 11) coupled to an exemplary convolutional compactor 1120 (the reset circuitry for the convolutional compactor 1120 is not shown). The circuit-under-test 1110 has three scan chains 1112 that output into the convolutional compactor 1120, which compacts the data from scan chains outputs into a single output 1122, producing six compacted test responses $P_1$ through $P_6$ from the values captured in the scan chains. In particular, the convolutional compactor 1120 comprises a shift register 1124, whose memory elements are coupled to the scan chains by means of additional 2-input XOR (or XNOR) gates 1126 (two of which are numbered in FIG. 11) interspersed between successive memory elements.

According to the diagnostic procedure described above with respect to FIGS. 5 and 6, a transformation function $\Phi$ can be determined that models the compactor 1120 (process block 504). A failure log indicative of failing test responses is received (process block 602). For purposes of this example, assume that the failure log indicates that failure occurred in three of the compacted test responses: $P_2$, $P_4$, and $P_5$. Using the transformation function $\Phi$, path-tracing can be performed into each logic cone associated with a corresponding failing compacted test response (or, equivalently, from each failing pseudo-scan-cell) to determine the initial fault candidates (process block 604). As can be verified in FIG. 11, the transformation functions of the compactor 1120 for the three observed failing test responses are as follows:

$$P_2 = (3 \oplus 6 \oplus R_1) \oplus (1 \oplus 4)$$

$$P_4 = (0 \oplus 3 \oplus 6) \oplus (1 \oplus 7) \oplus (5 \oplus 8)$$

$$P_5 = (1 \oplus 4 \oplus 7) \oplus (2 \oplus 8) \oplus R_2 \quad (7)$$

where $R_1$ and $R_2$ represent known values that are loaded into the compactor when it is reset or when the test responses in the circuit-under-test 1110 are shifted out. As in the above example, the transformation function can be more generally written:

$$P_2 = \Phi_2(\{1, 3, 4, 6\})$$

$$P_4 = \Phi_4(\{0, 1, 3, 5, 6, 7, 8\}), \text{ and}$$

$$P_5 = \Phi_5(\{1, 2, 4, 7, 8\}). \quad (8)$$

Figure 12:
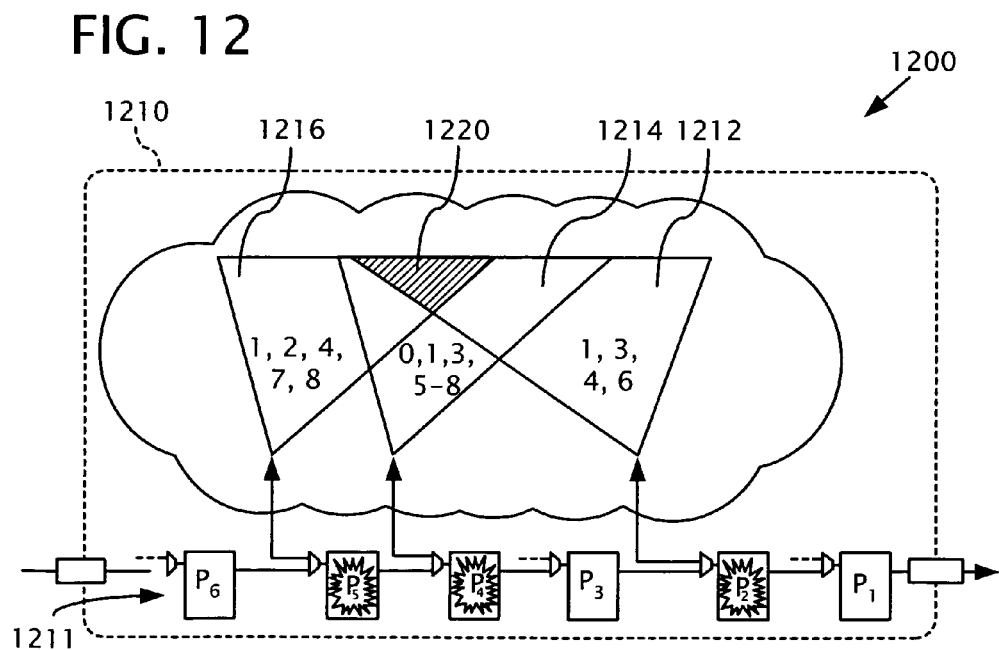
FIG. 12 is a schematic block diagram illustrating how an exemplary embodiment of the method shown in FIGS. 5 and 6 can be applied to the circuit-under-test and convolutional compactor from FIG. 11.

FIG. 12 is a schematic diagram 1200 conceptually illustrating a transformed circuit 1210. The transformed circuit 1210 represents the circuit-under-test 1110 after it has been transformed using the transformation functions $\Phi_2$, $\Phi_4$, and $\Phi_5$. As can be seen in FIG. 12, the transformed circuit 1210 has one pseudo-scan-chain 1212 with six pseudo-scan-cells ($P_1$ through $P_6$). In general, for a design with scan chain length L and a convolutional compactor with M memory elements in each compactor channel, the length of the pseudo-scan-chain is (L+M−1).

From the transformation functions $\Phi_2$, $\Phi_4$, $\Phi_5$, it can be observed that the faults that led to the observed failure $P_2$ (or, equivalently, the value at pseudo-scan-cell $P_2$ in the transformed circuit 1210) must have come from at least one of the scan cells 1, 3, 4, or 6. Also, the failure observed at $P_4$ must have come from (at least one of) the scan cells 0, 1, 3, 5, 6, 7, or 8, and the failure observed at $P_5$ must have come from (at least one of) the scan cells 1, 2, 4, 7, or 8. In some diagnostic methodologies, the intersection of these scan cells comprises the failing-scan-cell candidates from which path tracing can be performed. In the given example, for instance, scan cell 1 would be identified as the only scan cell candidate. According to the single-error assumption, this analysis is acceptable. However, in reality, it is possible that multiple scan cells captured failures and are clocked out during the same scan-out cycle. For example, with reference to FIG. 11, if the fault is located at the intersection of logic cones $LC_4$ and $LC_7$, and if the fault can propagate the fault effect to scan cells 4 and 7, it will produce the observed failure signature but will not be identified as a fault candidate.

By contrast, according to an implementation of the disclosed method 600, the intersection of the logic cone unions that contain the potential faults suspects is used to determine the initial fault candidates. For instance, in the illustrated example, the faults that led to the observed failure at $P_2$ must have come from the logic cone union 1212 ($LC_1 \cup LC_3 \cup LC_4 \cup LC_6$). Likewise, the faults that led to the observed failure at $P_4$ (or, equivalently, pseudo-scan-cell $P_4$ in the transformed circuit 1210) must have come from the logic cone union 1214 ($LC_0 \cup LC_1 \cup LC_3 \cup LC_4 \cup LC_5 \cup LC_6 \cup LC_7 \cup LC_8$). Finally, the faults that led to $P_5$ (or, equivalently, pseudo-scan-cell $P_5$ in the transformed circuit 1210) must have come from the logic cone union 1216 ($LC_1 \cup LC_2 \cup LC_4 \cup LC_7 \cup LC_8$). The list of initial fault candidates can be determined by finding the intersection of the logic cone unions 1212, 1214, 1216. This intersection is conceptually shown in FIG. 12 as area 1220.

Simulations of the test patterns in the circuit while injecting each fault candidate can be performed (process block 606). For each pattern simulated, the transformation function $\Phi$ is applied in order to get simulated results that can be compared to the data in the failure log. The remaining candidates can be ranked using, for example, criteria from any of the known effect-cause diagnostic methodologies (process block 608), thereby completing the exemplary diagnostic procedure 600.

EDT Compactor

The EDT compactor is described in J. Rajski, M. Kassab, N. Mukherjee, N. Tamarapalli, J. Tyszer, and J. Qian, "Embedded Deterministic Test for Low-Cost Manufacturing," *IEEE Design & Test of Computers*, Vol. 20, Issue 5, pp. 58-66 (September-October 2003). The EDT Compactor is essentially an XOR tree with scan chain masking to handle unknown values.

Figure 13:
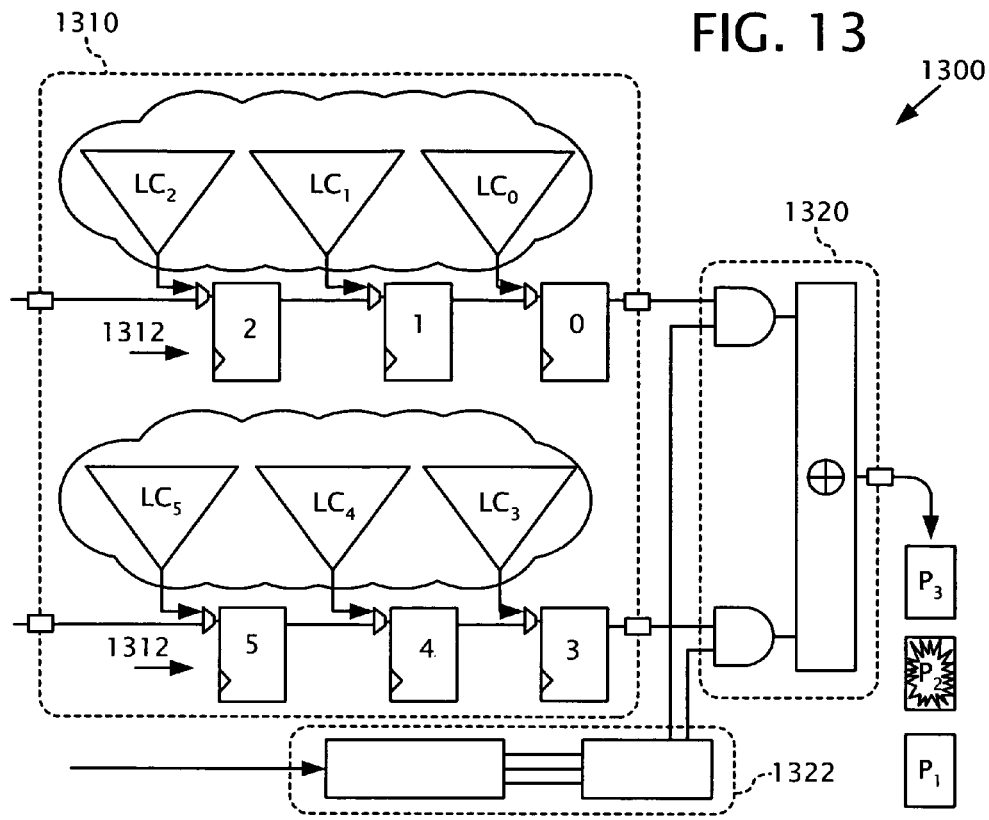
FIG. 13 is a schematic block diagram of an exemplary scan-based circuit-under-test coupled to an exemplary Embedded Deterministic Test (EDT) compactor.

FIG. 13 is a block diagram 1300 schematically showing an exemplary circuit-under-test 1310 having two scan chains 1312 coupled to an exemplary EDT compactor 1320, which comprises an XOR gate (bypass circuitry 1322 can be used to selectively mask one of the scan chains or all-but-one of the scan chains). For the circuit-under-test 1310, the EDT compactor 1320 produces three compacted test responses $P_1$ through $P_3$.

According to the diagnostic procedure described above with respect to FIGS. 5 and 6, a transformation function $\Phi$ can be determined that models the compactor 1320 (process block 504). A failure log indicative of failing test responses is received (process block 602). For purposes of this example, assume that the failure log indicates that a failure occurred in compacted test response $P_2$. Using the transformation function $\Phi$, path-tracing can be performed into each logic cone associated with a corresponding failing compacted test response (or, equivalently, from each failing pseudo-scan-cell) to determine the initial fault candidates for each observed failing response (process block 604). As can be verified from FIG. 13, the transformation function $\Phi_2$ of the compactor 1320 (assuming that none of the scan chains are masked) can be modeled as follows:

$$P_2 = (1 \oplus 4), \quad (9)$$

or more generally:

$$P_2 = \Phi_2(\{1, 4\}), \quad (10)$$

In the event that one or more of the scan chains is masked, equations (9) and (10) can be modified to account for the masking.

Figure 14:
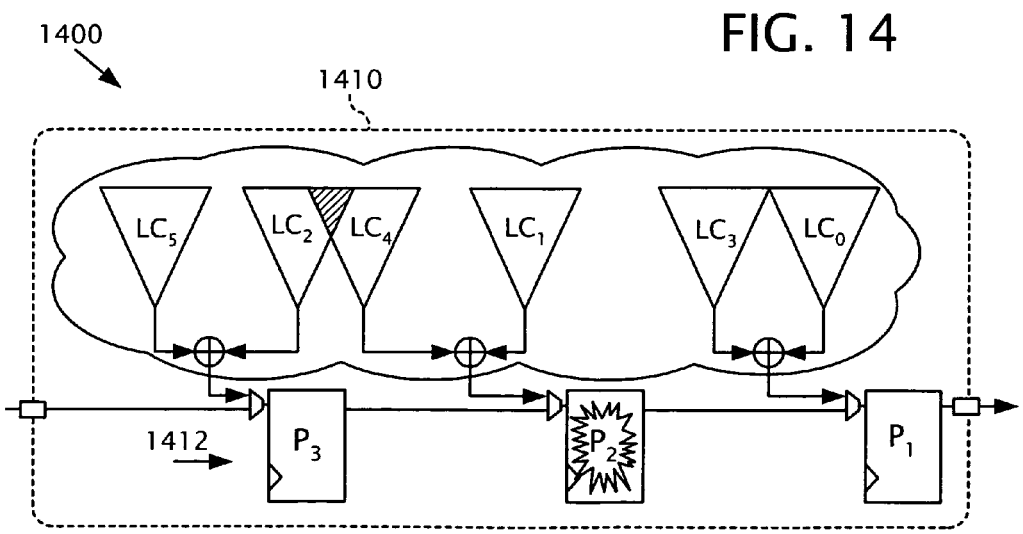
FIG. 14 is a schematic block diagram illustrating how an exemplary embodiment of the method shown in FIGS. 5 and 6 can be applied to the circuit-under-test and EDT compactor from FIG. 13.

FIG. 14 is a schematic diagram 1400 conceptually illustrating a transformed circuit 1410. The transformed circuit 1410 represents the circuit-under-test 1310 after it has been transformed using the transformation functions $\Phi_1$, $\Phi_2$, and $\Phi_3$. As can be seen in FIG. 14, the transformed circuit 1410 has one pseudo-scan-chain 1412 with three pseudo-scan-cells ($P_1$ through $P_3$). For illustrative purposes, the transformed circuit 1410 also shows that a portion of $LC_4$ intersects with $LC_2$ and could at least partially determine the value at pseudo-scan-cell $P_3$.

From the transformation function $\Phi_2$, it can be determined that the fault that led to the observed failure $P_2$ (or, equivalently, the value at pseudo-scan-cell $P_2$ in the transformed circuit 1410) must have come from the logic cone union $LC_1 \cup LC_4$. Thus, in this example, the list of initial fault candidates comprises the candidate faults in the union $LC_1 \cup LC_4$.

Simulations of the test patterns into the transformed circuit 1410 while simulating each fault candidate can be performed (process block 606). For each pattern simulated, the transformation function $\Phi$ is applied in order to get results that can be compared to the data collected in the failure log. For example, if the faults in the intersection between $LC_4$ and $LC_2$ create failing responses in both $P_2$ and $P_3$, then those fault candidates can be removed from the list. The remaining candidates can be ranked using, for example, criteria from any of the known effect-cause diagnostic methodologies (process block 608), thereby completing the exemplary diagnostic procedure 600.

Elementary-Tree Compactor

The elementary-tree compactor is described in B. Pouya and N. A. Touba, "Synthesis of Zero-Aliasing Elementary-Tree Space Compactors," *Proc. of IEEE VLSI Test Symposium*, pp. 70-77 (1998). The elementary-tree compactor is a nonlinear space compactor.

Figure 15:
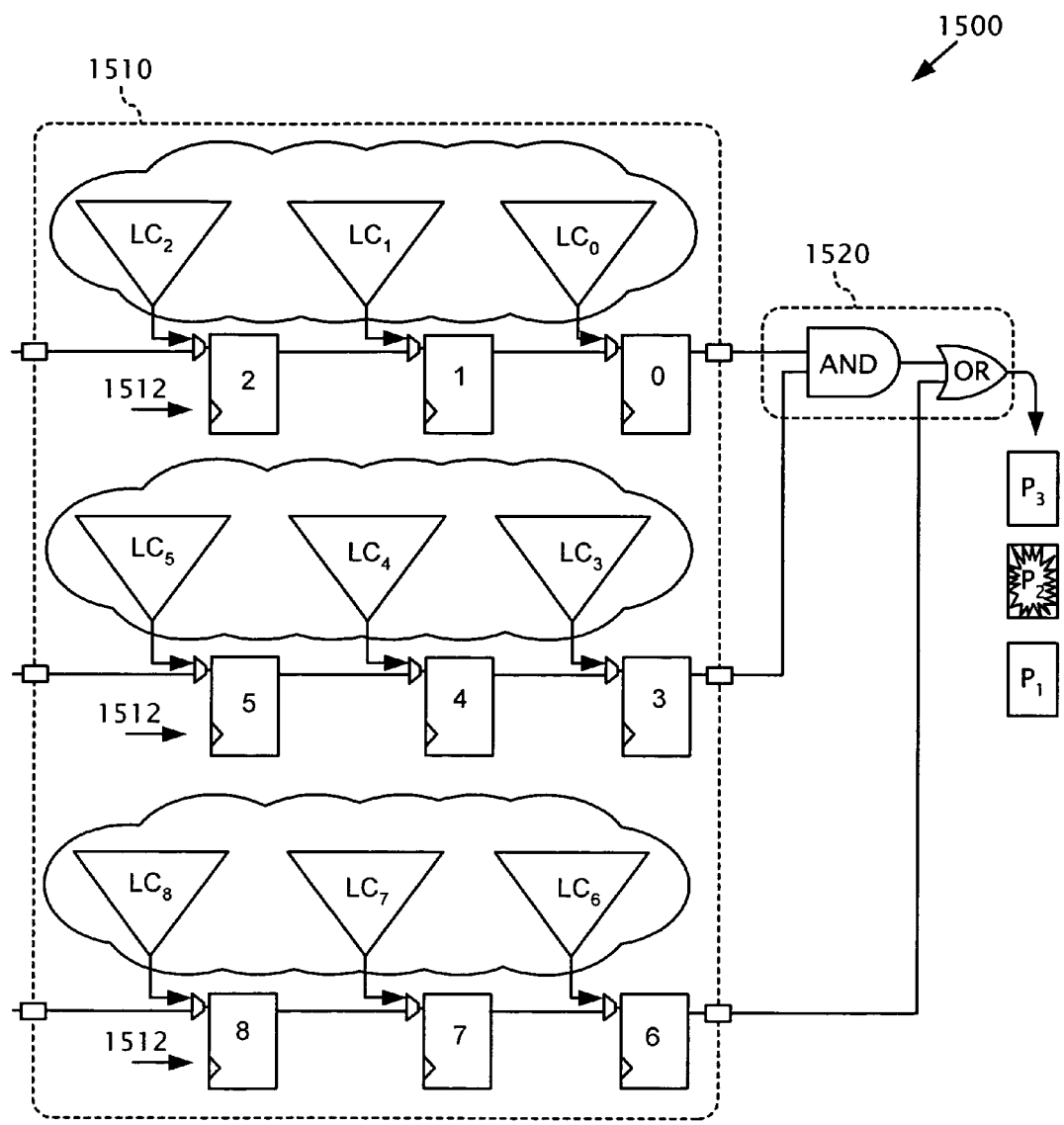
FIG. 15 is a schematic block diagram of an exemplary scan-based circuit-under-test coupled to an exemplary elementary-tree compactor.

FIG. 15 is a block diagram 1500 schematically showing an exemplary circuit-under-test 1510 having three scan chains 1512 coupled to an exemplary elementary-tree compactor 1520, which comprises an AND gate coupled to an OR gate. For the circuit-under-test 1510, the elementary-tree compactor 1520 produces three compacted test responses $P_1$ through $P_3$.

Using the diagnostic procedure described above with respect to FIGS. 5 and 6, a transformation function $\Phi$ can be determined that models the compactor 1520 (process block 504). A failure log indicative of failing test responses is received (process block 602). For purposes of this example, assume that the failure log indicates that a failure is found in compacted test response $P_2$. Using the transformation function $\Phi$, path-tracing can be performed into each logic cone associated with a corresponding failing compacted test response (or, equivalently, from each failing pseudo-scan-cell) to determine the initial fault candidates for each observed failing response (process block 604). In the illustrated example, the transformation function $\Phi_2$ of the compactor 1520 can be modeled as follows:

$$P_2 = (1 \text{ AND } 4) \text{ OR } 7, \tag{11}$$

or, more generally:

$$P_2 = \Phi_2(\{1, 4, 7\}). \tag{12}$$

Figure 16:
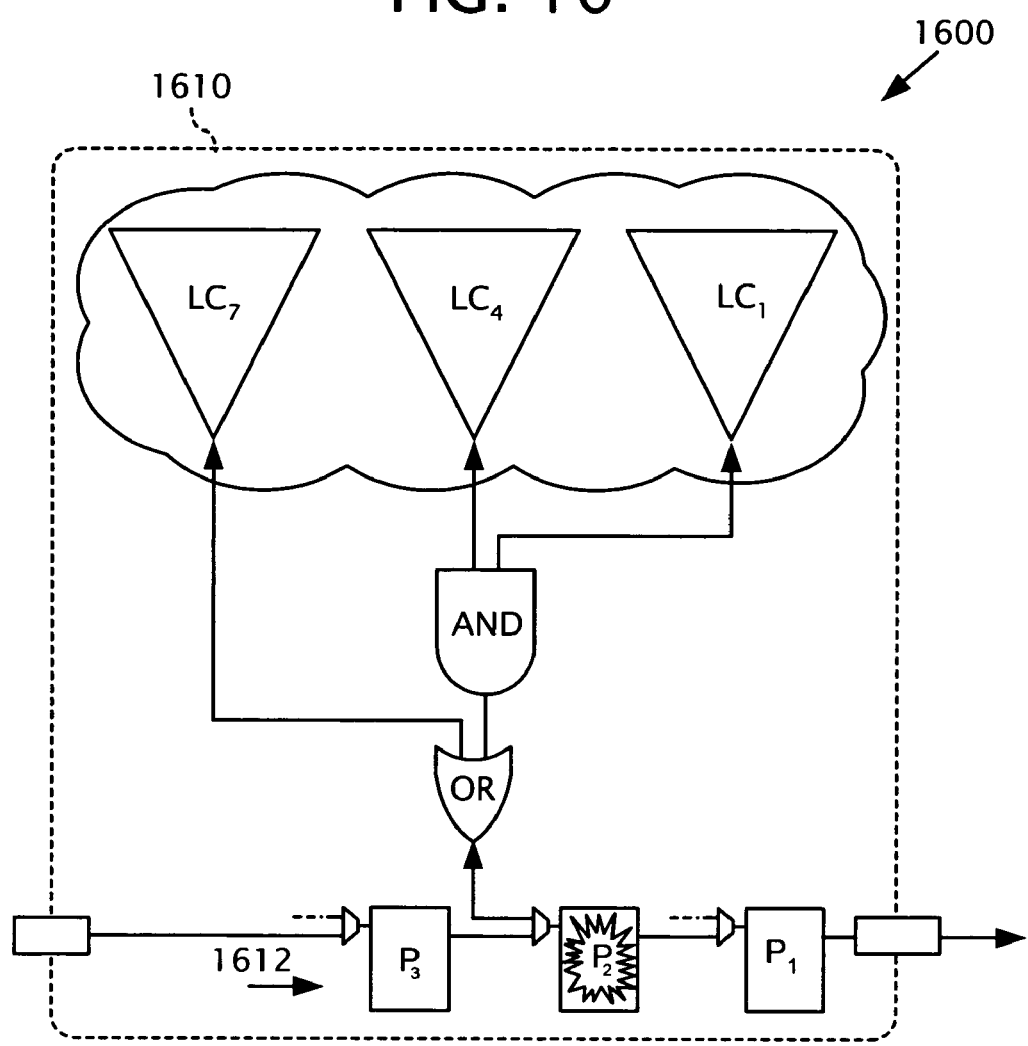
FIG. 16 is a schematic block diagram illustrating how an exemplary embodiment of the method shown in FIGS. 5 and 6 can be applied to the circuit-under-test and elementary-tree compactor from FIG. 15.

FIG. 16 is a schematic diagram 1600 showing a transformed circuit 1610. The transformed circuit 1610 represents the circuit-under-test 1510 after it has been transformed using the transformation function $\Phi_2$. As can be seen in FIG. 16, the transformed circuit 1610 has one pseudo-scan-chain 1612 with three pseudo-scan-cells ($P_1$ through $P_3$).

From the transformation function $\Phi_2$, it can be observed that the faults that led to the observed failure $P_2$ (or, equivalently, the value at pseudo-scan-cell $P_2$ in FIG. 16) must have come from the logic cone union $LC_1 \cup LC_4 \cup LC_7$. Thus, according to one exemplary implementation, the list of initial fault candidates comprises the candidate faults in the union $LC_1 \cup LC_4 \cup LC_7$.

Simulations of the test patterns into the transformed circuit 1610 while simulating each fault candidate can be performed (process block 606). For each pattern simulated, the transformation function $\Phi$ can be applied in order to get simulation results that can be compared to the data in the failure log. The remaining candidates can be ranked using, for example, criteria from any of the known effect-cause diagnostic methodologies (process block 608), thereby completing the exemplary diagnostic procedure 600.

Experimental Results

This section presents experimental results obtained by applying an exemplary embodiment of the diagnostic procedure discussed above. The experiments were performed by simulating industrial scan-based circuits having EDT compactors. Table 1 provides additional technical details for the industrial circuits tested (denoted as "Circuit 1" and "Circuit 2," respectively).

TABLE 1

Specifications of the Two Test Circuits

| | # of Gates | # of Scan Cells | # of Channels/<br># of Scan Chains | Compression<br>Ratio |
|---|---|---|---|---|
| Circuit 1 | 270K | 18.6K | 2/50 | 25X |
| Circuit 2 | 500K | 41K | 8/160 | 20X |

In Table 1, the column labeled "# of Scan Chains" indicates the number of internal scan chains, whereas the column labeled "# of Channels" indicates the number of output channels from the EDT compactor. For EDT compactors, the ratio of channels to chains generally determines the maximum possible compression ratio.

The experimental procedure utilized to generate these exemplary experimental results is outlined in Table 2:

TABLE 2

Experimental Procedure for Evaluating an Embodiment of the Disclosed Method in a Circuit-Under-Test Having an EDT Compactor 1. Create a set of sample faults consisting of 1000 randomly selected testable stuck-at faults
2. Generate a test set (using the complete fault set) in the compressed mode of the EDT compactor
3. Obtain a test set for bypass mode in the EDT compactor that is compatible with the compressed test set from Step 2
4. For each fault in the set of sample faults, perform the following in both compression and bypass modes:
    a. Inject one fault at a time, perform fault simulation with the test set from Step 2 for the compressed mode, and with the test set from Step 3 for bypass mode, and write the failures into a fail log
    b. Perform diagnosis using the fail log from Step a (while using appropriate test set for compressed and bypass mode)
    c. If the injected fault is in the suspect list reported in Step b:
        i. if diagnosis is effective, note the number of suspects listed;
        ii. if diagnosis is ineffective, note that the injected fault was not identified as a suspect.

As seen in Table 2, the first step in the experimental procedure was to randomly select 1000 sample faults (in this case, stuck-at faults). In the next step, a compressed test set was generated by targeting the full fault list. This test set was used to create a corresponding uncompressed test set for use when the EDT compactor is operated in bypass mode. (In bypass mode, direct access to the scan cells is provided by bypassing the on-chip compression hardware.) Each fault from the sample fault list was simulated by injecting the fault into a simulation of the circuit and the EDT compactor while operating the compactor in both compression mode and in bypass mode, thereby creating two failure logs: a compression-mode fail log and a bypass-mode fail log. For the particular experimental results presented below in FIGS. 17-20, two failure logs per circuit were considered: an unrestricted failure log (wherein all failing cycles that the fault simulation revealed were written to the failure log) and a 256-cycle failure log (wherein the failure log was restricted to no more than 256 failing cycles). The restricted 256-cycle failure log was analyzed because production-line ATE equipment often has memory limitations that restrict the number of fail log entries available (e.g., to 256 failing cycles). Each of the failure logs produced was then analyzed using respective diagnostic techniques. Specifically, the compression-mode failure log was analyzed using an embodiment of the direct diagnosis procedure outlined above with respect to FIG. 6, whereas the bypass-mode failure log was analyzed using the conventional bypass-mode diagnostic procedure for the EDT compactor. The results from each of the diagnostic procedures were then examined to determine whether the fault that was actually injected was listed as a suspect fault in the report and how many total fault suspects were reported for each observed error in the failure logs. According to this methodology, then, an ideal diagnostic report would identify one suspect fault for each sample fault.

Figure 17:
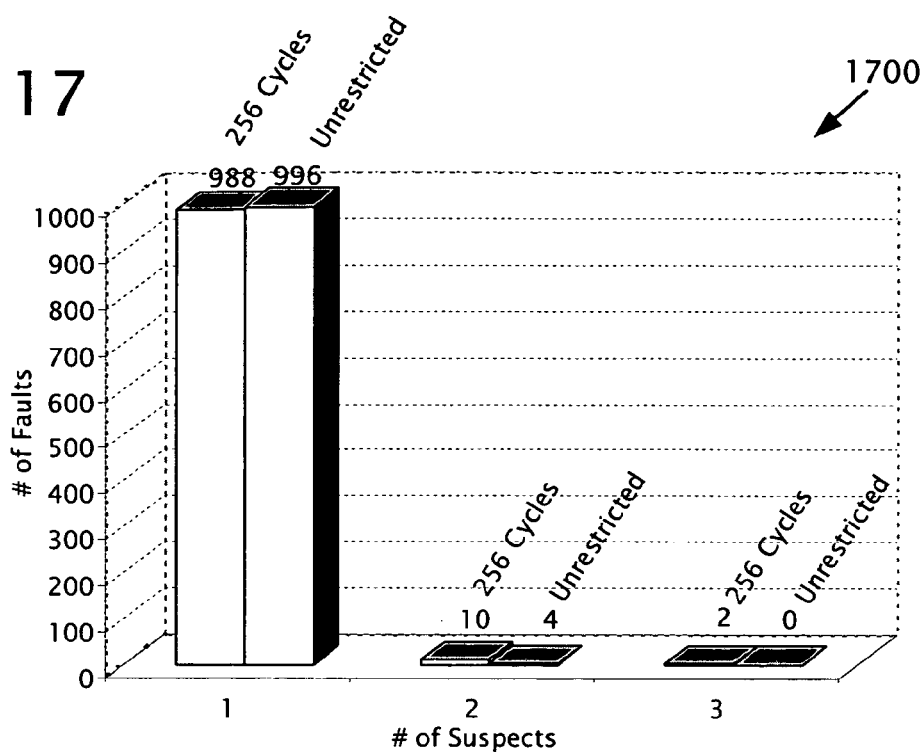
FIG. 17 is a graph showing experimental results from diagnosing failing test responses in a first circuit design having an EDT compactor, wherein a traditional fault diagnostic procedure was used and wherein the EDT compactor was operated in a bypass mode.
Figure 18:
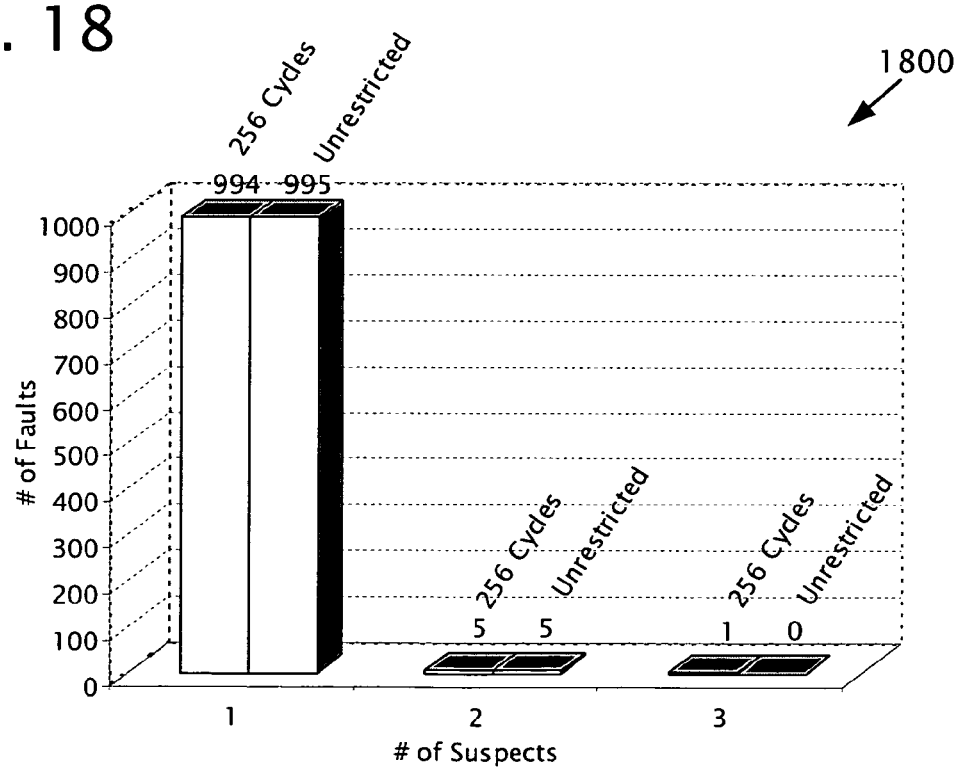
FIG. 18 is a graph showing experimental results from diagnosing failing test responses in the first circuit design having an EDT compactor, wherein an exemplary embodiment of the disclosed diagnostic procedure was used and wherein the EDT compactor was operated in a compression mode.

FIGS. 17-20 show the results of the experiments in graphical form. In particular, FIGS. 17 and 18 show graphs 1700 and 1800, respectively, which report the test results for Circuit 1. More precisely, FIG. 17 shows the results of diagnosing bypass-mode test response in Circuit 1 using the conventional bypass-diagnostic procedure, whereas FIG. 18 shows the results of diagnosing compression-mode test responses in Circuit 1 using the disclosed diagnostic embodiment. The X-axis in graph 1700 shows the number of suspects identified after diagnosis, whereas the Y-axis shows the number of sample faults for which the associated number of suspects were identified. As noted above, the tests were run using two failures logs: an unrestricted failure log and a failure log restricted to 256 cycles. With respect to FIGS. 17 and 18, it can be seen that for the unrestricted fail log, the bypass-mode diagnostic procedure reported one suspect for 996 faults, whereas the embodiment of the disclosed diagnostic procedure reported one suspect for 995 faults. When the failure log was restricted to 256 cycles, the embodiment of the disclosed diagnostic procedure reported a single suspect for 994 faults. By comparison, when the failure log was restricted to 256 cycles, the bypass-mode diagnostics reported a single suspect for 988 faults. This result is due to the failure log filling up faster in bypass mode than in the compressed mode.

Figure 19:
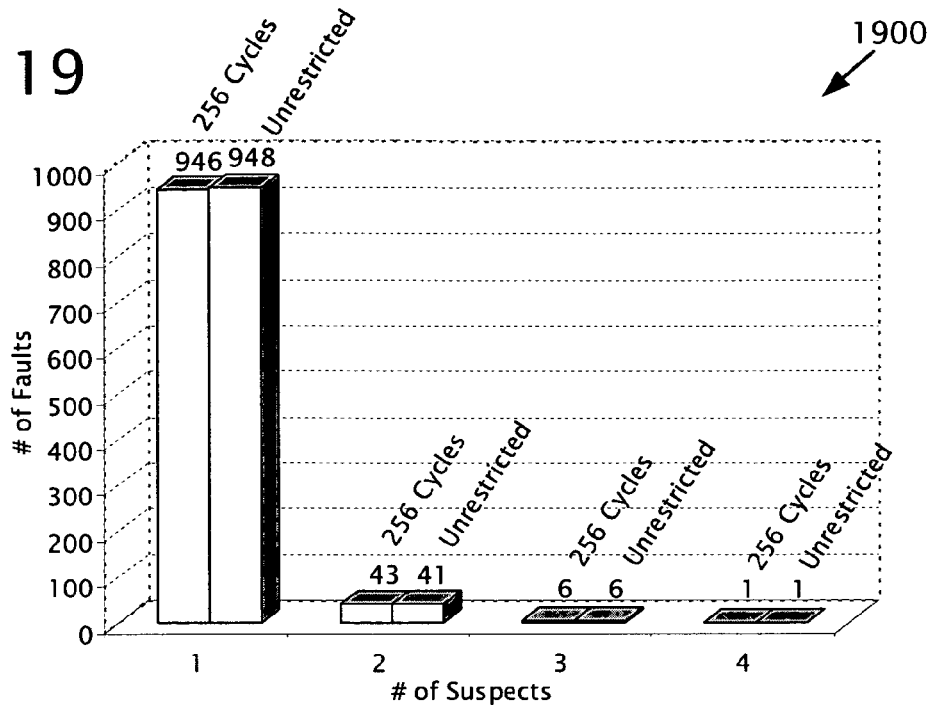
FIG. 19 is a graph showing experimental results from diagnosing failing test responses in a second circuit design having an EDT compactor, wherein a traditional fault diagnostic procedure was used and wherein the EDT compactor was operated in a bypass mode.
Figure 20:
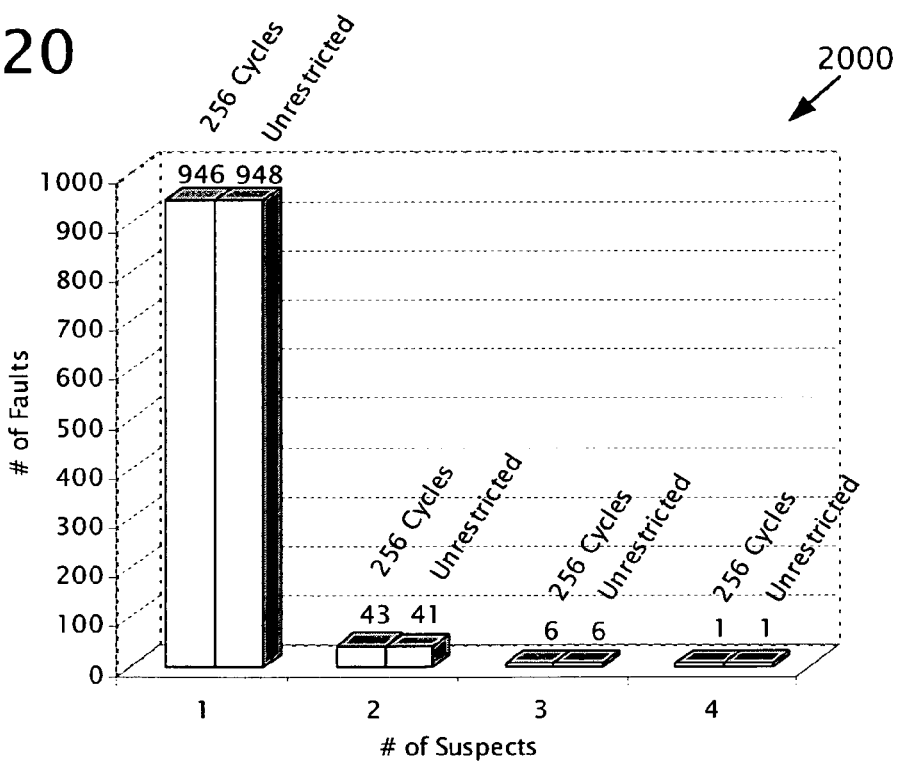
FIG. 20 is a graph showing experimental results from diagnosing failing test responses in the second circuit design having an EDT compactor, wherein an exemplary embodiment of the disclosed diagnostic procedure was used and wherein the EDT compactor was operated in a compression mode.

Similar results are shown for Circuit 2 in FIGS. 19 and 20, which contain respective graphs 1900 and 2000. In fact, for Circuit 2, identical results were obtained for the conventional bypass-mode diagnostic methods and the embodiment of the disclosed procedure. Note that in FIGS. 19 and 20, the total number of faults reported add up to 996 instead of 1000 because four faults (which respectively produced 5, 12, 22, and 31 suspects) are not shown in these figures.

As can be seen from FIGS. 17-20, the diagnostic resolution for the embodiment of the disclosed diagnostic procedure used in these tests was virtually as good or better than the diagnostic resolution achieved using bypass-mode diagnostics. However, because the exemplary embodiment of the disclosed diagnostic procedure does not require a separate set of test patterns, it is much more efficient and requires less memory overhead in the tester than bypass-mode diagnostics.

Exemplary Computer Networks

Figure 21:
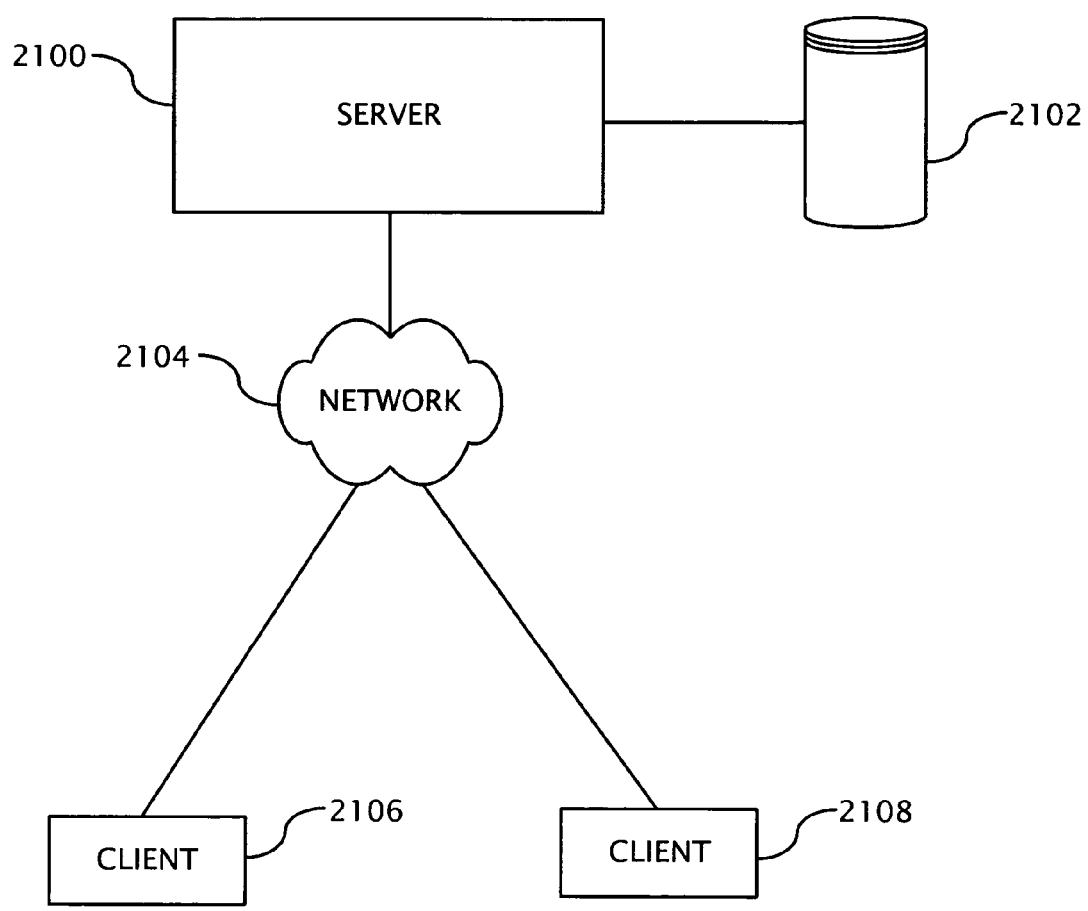
FIG. 21 is a schematic block diagram showing an exemplary distributed computing environment as might be used to implement the disclosed technology.

Any of the aspects of the technology described above may be performed using a distributed computer network. FIG. 21 shows one such exemplary network. A server computer 2100 can have an associated storage device 2102 (internal or external to the server computer). For example, the server computer 2100 can be configured to perform a fault diagnostic technique according to any of the disclosed embodiments (e.g., as part of an EDA software tool, such as an embedded deterministic testing (EDT) or ATPG tool). The server computer 2100 may be coupled to a network, shown generally at 2104, which can comprise, for example, a wide-area network, a local-area network, a client-server network, the Internet, or other such network. One or more client computers, such as those shown at 2106, 2108, may be coupled to the network 2104 using a network protocol.

Figure 22:
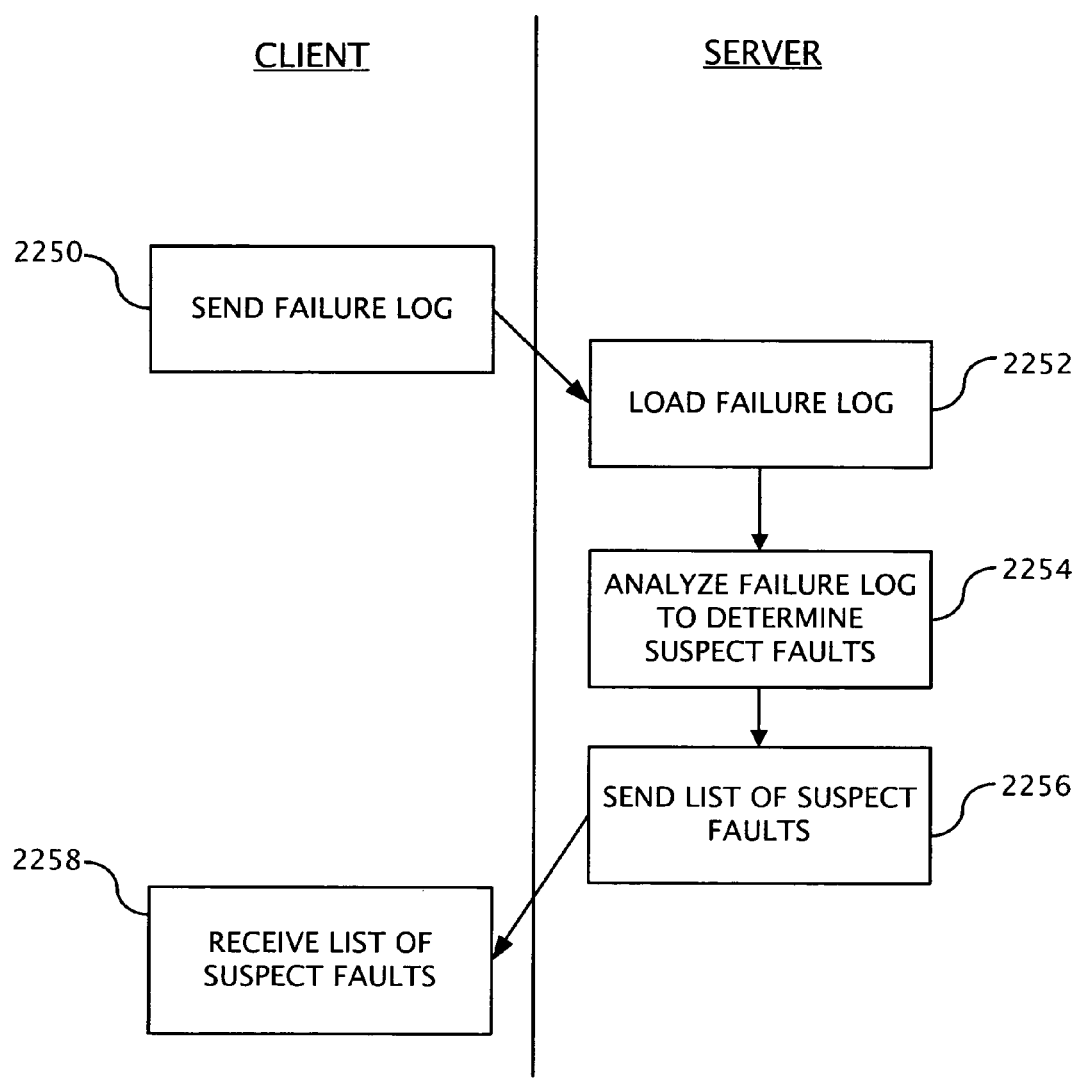
FIG. 22 is a block diagram showing an exemplary manner in which fault diagnosis can be performed in the distributed computing environment illustrated in FIG. 21.

FIG. 22 shows one exemplary manner in which the distributed network shown in FIG. 21 may operate to diagnose faults stored in a failure log. In particular, a failure log containing information concerning observed faults from a circuit-under-test may be analyzed according to any of the embodiments disclosed herein using a remote server computer, such as the server computer 2100 shown in FIG. 21. In process block 2250, for example, the client computer sends a failure log (from ATE on a production floor, for example) comprising a list of observed faults from a circuit test. In process block 2252, the failure log is received and loaded by the server computer. In process block 2254, the failure log is analyzed using a diagnostic procedure according to any of the disclosed embodiments. A list of fault suspects identified by the diagnostic procedure can be created. The list of fault suspects can be stored as an updated version of the failure log or as one or more separate files or data structures. In process block 2256, the server computer sends the list of suspect faults to the client computer, which receives the diagnostic results in process block 2258. Note that this procedure can occur as the failure log is being created or very shortly after the failure log is created (while the circuit-under-test is still coupled to the tester, for example), thus the diagnostic procedure can be performed on-line.

It should be apparent to those skilled in the art that the example shown in FIG. 22 is not the only way to perform diagnostics according to the disclosed technology. For instance, the failure log to be analyzed may be stored on a computer-readable medium that is not on a network and that is sent separately to the server (e.g., on a CD-ROM or other computer-readable medium). Moreover, the server computer may perform only a portion of the diagnostic procedure.

Having illustrated and described the principles of the illustrated embodiments, it will be apparent to those skilled in the art that the embodiments can be modified in arrangement and detail without departing from such principles. For example, any of the embodiments described herein can be performed by the tester itself and need not be performed over a distributed computer network. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A method, comprising:

receiving a failure log comprising one or more entries indicative of failing test responses captured in a circuit-under-test and compressed by a compactor, the circuit-under-test comprising scan cells that receive test responses from corresponding logic cones;

identifying one or more candidate logic cones for a selected entry of the failure log using a transformation function indicative of which logic cones in the circuit-under-test at least partially contribute to respective failing test responses;

finding fault candidates in the one or more candidate logic cones using a representation of the circuit-under-test; and storing a list of the fault candidates in a computer-readable medium.

2. The method of claim 1, further comprising, for a selected fault candidate, simulating one or more of the failing test patterns in a representation of the circuit-under-test and the compactor, the representation including the selected fault candidate.

3. The method of claim 2, wherein the representation of the circuit-under-test and the compactor represents the scan cells of the circuit-under-test as being replaced by pseudo-scan-cells adapted to capture test responses after compression.

4. The method of claim 1, wherein the transformation function comprises a mathematical representation of the compactor.

5. The method of claim 1, wherein one or more candidate logic cones are identified for multiple respective entries of the failure log, each of the multiple respective entries of the failure log being associated with a single test pattern, the method further comprising finding fault candidates at the intersection of the union of the identified candidate logic cones for the multiple respective entries of the failure log.

6. The method of claim 1, wherein the compactor is a space compactor.

7. The method of claim 1, wherein the compactor is an infinite input response compactor.

8. The method of claim 1, wherein the compactor is a finite input response compactor.

9. The method of claim 1, wherein the compactor comprises masking logic.

10. One or more computer-readable media comprising computer-executable instructions for causing a computer system to perform the method of claim 1.

11. One or more computer-readable media comprising a list of fault candidates determined by the method of claim 1.

12. A circuit having a repaired fault that was identified using the method of claim 1.

13. A method, comprising:
transforming a representation of a circuit-under-test into a representation of a transformed circuit-under-test,
storing the representation of the transformed circuit-under-test in a computer-readable medium;
wherein the circuit-under-test comprises scan cells that capture test responses from respective logic cones and a compactor that compresses the captured test responses, and
wherein the transformed circuit-under-test replaces one or more of the scan cells in the circuit-under-test with one or more pseudo-scan-cells configured to capture respective compacted test responses, the one or more pseudo-scan-cells being associated with corresponding logic cones in the transformed circuit-under-test via a representation of the compactor.

14. The method of claim 13, further comprising diagnosing faults in the circuit-under-test using the representation of the transformed circuit-under-test.

15. The method of claim 14, wherein the diagnosing is performed using an effect-cause diagnostic procedure.

16. The method of claim 15, wherein the effect-cause diagnostic procedure comprises determining a list of fault candidates by path tracing in the representation of the transformed circuit-under-test from one or more of the pseudo-scan-cells into respective associated candidate logic cones.

17. The method of claim 13, wherein the representation of the compactor in the representation of the transformed circuit-under-test indicates which logic cones in the circuit-under-test at least partially contribute to respective failing test responses without representing the Boolean function of the compactor.

18. One or more computer-readable media comprising computer-executable instructions for causing a computer system to perform the method of claim 13.

19. One or more computer-readable media comprising a list of fault candidates determined by the method of claim 13.

20. A circuit having a repaired fault that was identified using the method of claim 13.

21. A method, comprising:
receiving a failure log, the failure log being indicative of compressed, failing responses of a circuit-under-test to test patterns applied to the circuit-under-test, the failing responses having been first captured in scan cells of the circuit-under-test and then compressed by a compactor;
applying a mathematical representation of the compactor to one or more failing responses associated with one of the test patterns to identify one or more respective candidate logic cones wherein a fault causing the one or more failing responses might exist;
applying an effect-cause diagnostic procedure to the one or more respective candidate logic cones to produce diagnostic procedure results; and
storing the diagnostic procedure results in a computer-readable medium.

22. The method of claim 21, wherein the effect-cause diagnostic procedure comprises path tracing into the one or more respective logic cones identified using a representation of the circuit-under-test, the path tracing being performed to determine a list of fault candidates.

23. The method of claim 22, wherein the path tracing is performed in parallel into multiple ones of the respective candidate logic cones.

24. The method of claim 22, wherein the list of fault candidates consists of fault candidates in the intersection of unions of the respective candidate logic cones.

25. The method of claim 22, further comprising, for at least one of the fault candidates, simulating application of one or more of the test patterns to the circuit-under-test and the compactor with the at least one of the fault candidates being present in the circuit-under-test.

26. The method of claim 21, wherein the mathematical representation of the compactor indicates which logic cones in the circuit-under-test at least partially contribute to corresponding failing test responses without representing the Boolean function of the compactor.

27. One or more computer-readable media comprising computer-executable instructions for causing a computer system to perform the method of claim 21.

28. One or more computer-readable media comprising a list of fault candidates determined by the method of claim 21.

29. A circuit having a repaired fault that was identified using the method of claim 21.

30. A method, comprising:
receiving information indicative of one or more failing test responses of a circuit-under-test to one or more test patterns applied to the circuit-under-test, the failing test responses being first captured in scan cells of the circuit-under-test and then compressed by a compactor;
identifying fault candidates for one or more of the failing test responses using a path-tracing technique applied to a representation of a transformed circuit-under-test, wherein the representation of the transformed circuitunder-test represents the failing test responses as being compacted first and then captured in pseudo-cell-scans; and storing a list of the identified fault candidates in a computer-readable medium.

31. The method of claim 30, wherein the portion of the representation of the circuit-under-test associated with compacting the failing test responses comprises a transformed circuit description.

32. The method of claim 30, wherein the portion of the representation of the circuit-under-test associated with compacting the failing test responses comprises a mathematical relationship.

33. One or more computer-readable media comprising computer-executable instructions for causing a computer system to perform the method of claim 30.

34. One or more computer-readable media comprising a list of fault candidates determined by the method of claim 30.

35. A circuit having a repaired fault that was identified using the method of claim 30.

36. A method, comprising:

receiving a circuit description of an at least partially scan-based circuit-under-test and a compactor for compacting test responses captured in the circuit-under-test;

determining a transformation function performed by the compactor to the test responses captured in the circuit-under-test;

modifying a diagnostic procedure for evaluating uncompressed test responses into a modified diagnostic procedure that incorporates the transformation function therein; and storing the diagnostic procedure in a computer-readable medium.

37. The method of claim 36, wherein the modified diagnostic procedure is an effect-cause diagnostic procedure.

38. The method of claim 36, wherein the modified diagnostic procedure comprises:

receiving a failure log of failing test responses observed in the circuit-under-test and compressed by the compactor;

identifying sets of fault candidates in logic cones associated with respective failing test responses; and determining an intersection between the sets of fault candidates.

39. One or more computer-readable media comprising computer-executable instructions for causing a computer system to perform the method of claim 36.

40. One or more computer-readable media comprising a circuit description modified by the method of claim 36.

41. A circuit having a repaired fault that was identified using the method of claim 36.

42. A method, comprising:

receiving a circuit description of an at least partially scan-based circuit-under-test and a compactor for compacting test responses captured in scan cells of the circuit-under-test, the scan cells being located upstream of the compactor;

determining a transformation function performed by the compactor to the test responses captured in the scan cells of the circuit-under-test;

modifying the circuit description to remove the compactor and embed the transformation function upstream of the scan cells in the circuit-under-test, thereby replacing the scan cells with pseudo-scan-cells; and storing the modified circuit description in a computer-readable medium.

43. The method of claim 42, further comprising performing diagnostics using the modified circuit description, the diagnostics being performed using a diagnostic procedure for evaluating uncompressed test responses.

44. One or more computer-readable media comprising computer-executable instructions for causing a computer system to perform the method of claim 42.

45. One or more computer-readable media comprising a circuit description modified by the method of claim 42.

46. A circuit having a repaired fault that was identified using the method of claim 42.

* * * * *